(12) United States Patent
Osawa

(10) Patent No.: US 12,135,340 B2
(45) Date of Patent: Nov. 5, 2024

(54) CURRENT DETECTION DEVICE WITH VOLTAGE DETECTING PORTION POSITIONING

(71) Applicant: KOA CORPORATION, Ina (JP)

(72) Inventor: Ryou Osawa, Ina (JP)

(73) Assignee: KOA CORPORATION, Ina (JP)

( * ) Notice: Subject to any disclaimer, the term of this patent is extended or adjusted under 35 U.S.C. 154(b) by 154 days.

(21) Appl. No.: 17/919,944

(22) PCT Filed: Apr. 20, 2021

(86) PCT No.: PCT/JP2021/016076
§ 371 (c)(1),
(2) Date: Oct. 19, 2022

(87) PCT Pub. No.: WO2021/220895
PCT Pub. Date: Nov. 4, 2021

(65) Prior Publication Data
US 2023/0152352 A1    May 18, 2023

(30) Foreign Application Priority Data
Apr. 27, 2020  (JP) ................. 2020-078262

(51) Int. Cl.
*G01R 15/14* (2006.01)
*H01C 1/14* (2006.01)
(Continued)

(52) U.S. Cl.
CPC .............. *G01R 15/146* (2013.01); *H01C 1/14* (2013.01); *H01C 7/06* (2013.01); *H01C 17/00* (2013.01)

(58) Field of Classification Search
CPC .. G01R 1/203; G01R 15/146; G01R 19/0092; H01C 1/14; H01C 1/148; H01C 17/24; H01C 3/12; H01C 7/06; H01C 17/00
See application file for complete search history.

(56) References Cited

U.S. PATENT DOCUMENTS

2008/0030208 A1  2/2008  Aratani
2008/0171232 A1  7/2008  Aoki et al.
(Continued)

FOREIGN PATENT DOCUMENTS

JP  H06-267707 A  9/1994
JP  2002-519672 A  7/2002
(Continued)

OTHER PUBLICATIONS

International Search Report dated Jul. 13, 2021, issued in counterpart International Application No. PCT/JP2021/016076, w/English Translation. (4 pages).
(Continued)

*Primary Examiner* — Jay Patidar
(74) *Attorney, Agent, or Firm* — WHDA, LLP

(57) ABSTRACT

A current detection device (30) includes a resistance element (5), and a pair of electrodes (6, 7). The current detection device (30) has a projecting portion (11). The projecting portion (11) has a portion of the resistance element (5) and portions of the pair of electrodes (6, 7). The electrodes (6, 7) have first wall portions (66b, 67b) forming a portion of the projecting portion (11), and second wall portions (66a, 67a) forming the portion of the projecting portion (11). The electrodes (6, 7) have detection areas (66, 67) demarcated by the first wall portion (66b, 67b), the second wall portion (66a, 67a), a leading end portion (66c, 67c), and a contact surface (6a, 7a). The electrodes (6, 7) have voltage detecting portions (20, 21). The voltage detecting portions (20, 21) are arranged in the detection areas (66, 67) with a gap between the leading end portions (66c, 67c).

4 Claims, 24 Drawing Sheets

(51) Int. Cl.
    *H01C 7/06*    (2006.01)
    *H01C 17/00*   (2006.01)

(56) References Cited

U.S. PATENT DOCUMENTS

| | | |
|---|---|---|
| 2011/0057764 A1 | 3/2011 | Smith et al. |
| 2014/0002232 A1 | 1/2014 | Smith et al. |
| 2017/0307658 A1 | 10/2017 | Chiku et al. |
| 2018/0122538 A1 | 5/2018 | Smith et al. |
| 2018/0174721 A1 | 6/2018 | Kameko et al. |
| 2019/0326038 A1* | 10/2019 | Smith ................ H01C 17/232 |
| 2020/0011899 A1 | 1/2020 | Tsukahara et al. |
| 2020/0200799 A1 | 6/2020 | Hung et al. |
| 2021/0375510 A1 | 12/2021 | Kim |
| 2022/0102032 A1 | 3/2022 | Ko |

FOREIGN PATENT DOCUMENTS

| | | | | |
|---|---|---|---|---|
| JP | 2004-165430 A | | 6/2004 | |
| JP | 2007-329421 A | | 12/2007 | |
| JP | 2008-39571 A | | 2/2008 | |
| JP | 2011-47721 A | | 3/2011 | |
| JP | 2013-504213 A | | 2/2013 | |
| JP | 2014-090205 A | | 5/2014 | |
| JP | 2017-5204 A | | 1/2017 | |
| JP | 2018004267 A | * | 1/2018 | ............ G01R 15/00 |
| JP | 2019-71418 A | | 5/2019 | |
| JP | 2020-102626 A | | 7/2020 | |
| WO | 00/00833 A1 | | 1/2000 | |
| WO | 2016/063928 A1 | | 4/2016 | |
| WO | 2016/204038 A1 | | 12/2016 | |
| WO | 2018/150869 A1 | | 8/2018 | |
| WO | 2018/229817 A1 | | 12/2018 | |
| WO | WO-2019031140 A1 | * | 2/2019 | ............ G01R 1/203 |

OTHER PUBLICATIONS

International Search Report dated Oct. 27, 2020, issued in International Application No. PCT/JP2020/032176, with English translation (counterpart to U.S. Appl. No. 17/920,927). (4 pages).

Related co-pending U.S. Appl. No. 17/920,927.

Non-Final Office Action dated Jul. 2, 2024, issued in U.S. Appl. No. 17/920,927. (29 pages).

Extended (Supplementary) European Search Report dated Jun. 11, 2024, issued in counterpart EP application No. 20933233.7. (10 pages).

* cited by examiner

CURRENT DETECTION DEVICE WITH VOLTAGE DETECTING PORTION POSITIONING

TECHNICAL FIELD

The present invent on relates to a current detection device, and more particularly to a current detection device using a shunt resistor.

BACKGROUND ART

A shunt resistor is widely used in current detection applications. Such a shunt resistor includes a resistance element and electrodes joined to both ends of the resistance element. In general, the resistance element is made of resistance alloy such as copper-nickel alloy, copper-manganese alloy, iron-chromium alloy, or nickel-chromium alloy. The electrodes are made of highly conductive metals such as copper. A voltage detecting portion is provided on the electrode, and the voltage generated at the both ends of the resistance element is detected by connecting a conducting wire (e.g., aluminum wire) to the voltage detecting portion.

FIGS. 33 and 34 show an example of a conventional shunt resistor. As shown in FIGS. 33 and 34, the shunt resistor 100 includes a plate-shaped resistance element 105 having a predetermined thickness and width and made of a resistive alloy, and a pair of electrodes 106 and 107 made of highly conductive metal connected to both ends of the resistance element 105. Bolt holes 108 and 109 for fixing the shunt resistor 100 with screws or the like are formed in the electrodes 106 and 107, respectively.

The shunt resistor 100 further includes voltage detecting portions 120 and 121 for measuring a voltage of the resistance element 105. In the example shown in FIG. 33, the voltage detecting portions 120 and 121 are formed integrally with the electrodes 106 and 107, respectively. The voltage detecting portions 120 and 121 extend in a width direction of the electrodes 106 and 107 from side surfaces of the electrodes 106 and 107. The voltage detecting portions 120 and 121 are arranged near the resistance element 105.

In the example shown in FIG. 34, the voltage detecting portions 120 and 121 are pins extending vertically from the surfaces of the electrodes 106 and 107, respectively. The voltage detecting portions 120 and 121 are arranged near the resistance element 105.

CITATION LIST

Patent Literature

Patent document 1: Japanese laid-open patent publication No. 2017-5204
Patent document 2: Japanese laid-open patent publication No. 2007-329421

SUMMARY OF INVENTION

Technical Problem

A temperature coefficient of resistance (TCR) characteristic is important in the shunt resistor to allow current detection under a condition that is less affected by a temperature fluctuation. The temperature coefficient of resistance is an index that indicates a rate of change in a resistance value due to temperature. Accordingly, it is an object of the present invention to provide a current detection device using a shunt resistor that has a simple structure and can satisfy a desired temperature coefficient of resistance.

Solution to Problem

In an embodiment, there is provided a current detection device used for current detection, comprising: a resistance element; and a pair of electrodes connected to both ends of the resistance element in a first direction, the current detection device has a projecting portion projecting in a second direction, the projecting portion has a portion of the resistance element and portions of the pair of electrodes, the first direction is a direction in which the pair of electrodes are arranged, and the second direction is perpendicular to the first direction, each electrode has a first wall portion along the first direction forming a portion of the projecting portion, and a second wall portion along the second direction forming the portion of the projecting portion, each electrode has a detection area demarcated by the first wall portion, the second wall portion, a leading end portion, and a contact surface, the leading end portion being a boundary between the projecting portion and a body of the electrode, the contact surface being at least partially in contact with the resistance element, and each electrode has a voltage detecting portion, the voltage detecting portion being arranged in the detection area with a gap between the leading end portions.

In an embodiment, the voltage detecting portion is arranged closer to the resistance element than a center of the detection area.

In an embodiment, the detection area projects more than the resistance element in a thickness direction of the current detection device.

In an embodiment, a length of the first wall portion is longer than a length of the second wall portion.

In an embodiment, the current detection device further includes a wiring substrate, the wiring substrate comprises a detection pad connected to the voltage detecting portion.

In a reference example, there is provided a plate shunt resistor used for current detection, comprising: a resistance element; and a pair of electrodes connected to both ends of the resistance element in a first direction, the shunt resistor has a projecting portion formed on a first side surface of the shunt resistor, the first side surface being parallel to the first direction, and a recessed portion formed on a second side surface of the first side surface of the shunt resistor, the second side surface being an opposite side of the first side surface, the recessed portion extending in the same direction as the projecting portion, the projecting portion has a portion of the resistance element and portions of the pair of electrodes, and the recessed portion has a side of the resistance element parallel to the first direction.

In a reference example, a length of the recessed portion in the second direction perpendicular to the first direction is the same as a length of the projecting portion in the second direction.

In a reference example, the projecting portion includes a pair of voltage detecting portions connected to both ends of the resistance element in the first direction.

In a reference example, the projecting portion and the recessed portion have a rectangular shape.

In a reference example there is provided a method for manufacturing a shunt resistor comprising: a resistance element; and a pair of electrodes connected to both ends of the resistance element, preparing a long shunt resistor base material in which the pair of electrodes are connected to the both ends of the resistance element in a first direction;

forming a projecting portion of the first shunt resistor having a portion of the resistance element of a first shunt resistor and portions of the pair of electrodes of the first shunt resistor by cutting the shunt resistor base material in the first direction in a convex shape; forming a recessed portion extending in the same direction as the projecting portion of the first shunt resistor and a projecting portion of a second shunt resistor by cutting the shunt resistor base material in the first direction into a convex shape spaced apart from the projecting portion, the projecting portion of the second shunt resistor has a portion of the resistance element of the second shunt resistor and portions of the pair of electrodes of the second shunt resistor.

In a reference example, there is provided a current detection device comprising: the above shunt resistor; and a current detection circuit substrate having a voltage signal wiring transmitting a voltage signal from the shunt resistor, the voltage signal wiring is electrically connected to as projecting portion of the shunt resistor.

In a reference example, the current detection circuit substrate further has a voltage terminal pad, the voltage terminal pad is connected to the projecting portion and the voltage signal wiring.

In a reference example, the current detection device further includes an output terminal outputting a voltage signal from the shunt resistor, and the output terminal is attached to the recessed portion of the shunt resistor.

Advantageous Effects of Invention

The desired temperature coefficient of resistance can be satisfied by arranging the voltage detecting portion at a desired position with a gap between the leading end portions in the detection area of the electrode which constitutes a portion of the projecting portion of the current detection device.

DESCRIPTION OF EMBODIMENTS

Figure 1:
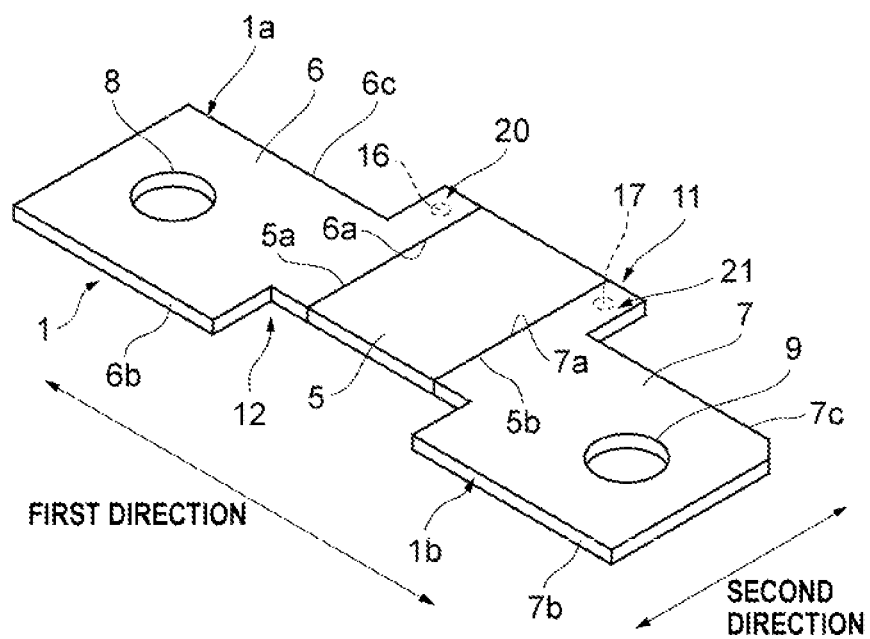
FIG. 1 is a perspective view showing one embodiment of a shunt resistor.

Embodiments of the present invention will now be described with reference to the drawings. In the drawings described hereinbelow, the same symbols are used to refer to the same or equivalent components or elements, and a duplicate description thereof is omitted. In a plurality of embodiments described below, configurations of one embodiment not specifically described are the same as the other embodiments, so its redundant description is omitted.

Figure 2:
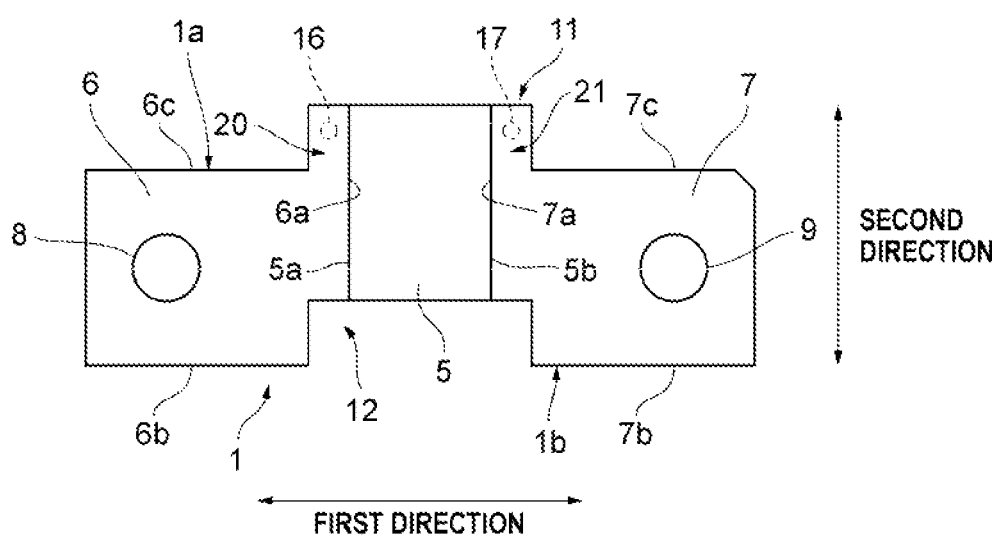
FIG. 2 is a plan view of the shunt resistor shown in FIG. 1.

FIG. 1 is a perspective view showing one embodiment of a shunt resistor 1, and FIG. 2 is a plan view of the shunt resistor 1 shown in FIG. 1. As shown in FIGS. 1 and 2, the shunt resistor 1 includes a resistance element 5 made of a resistor alloy plate material having a predetermined thickness and width, and a pair of electrodes 6 and 7 made of a highly conductive metal connected to both ends (i.e., both connecting surfaces) 5a and 5b of the resistance element 5 in a first direction. The electrode 6 has a contact surface 6a that contacts one end (one connecting surface) 5a of the resistance element 5, and the electrode 7 has a contact surface that contacts the other end (other connecting surface) 5b of the resistance element 5. Bolt holes 8 and 9 for fixing the shunt resistor 1 with screws or the like are formed in the electrodes 6 and 7, respectively.

The first direction is a length direction of the resistance element 5 and corresponds to the length direction of the shunt resistor 1. The length direction of the shunt resistor 1 is a direction in which the electrode 6, the resistance element 5, and the electrode 7 are arranged in this order. A direction perpendicular to this first direction is a second direction. The second direction is a width direction of the shunt resistor 1. As shown in FIGS. 1 and 2, the electrodes 6 and 7 have the same structure and are arranged symmetrically with respect to the resistance element 5.

The both ends 5a and 5b of the resistance element 5 are connected (bonded) to the electrodes 6 and 7 by means of welding (e.g., electron beam welding, laser beam welding, or brazing), respectively. An example of the material of the resistance element 5 is as low-resistance alloy material such as a Cu—Mn alloy. An example of the material of the electrodes 6 and 7 is copper (Cu).

The shunt resistor 1 has a projecting portion 11 formed on a side surface 1a of the shunt resistor 1, and a recessed portion 12 formed on a side surface 1b of the shunt resistor 1. The projecting portion 11 extends outward from the side surface 1a, and the recessed portion 12 extends inward (toward a center of the shunt resistor 1) from the side surface 1b. Both the projecting portion 11 and the recessed portion 12 extend in the same direction (second direction). The projecting portion 11 and the recessed portion 12 have a rectangular shape when viewed from above (when viewed from a direction perpendicular to both the first direction and the second direction).

The side surface 1a is a surface of the shunt resistor 1 parallel to the first direction, and has a side surface 6c of the electrode 6 and a side surface 7c of the electrode 7. The side surface 1b is a surface of the shunt resistor 1 parallel to the first direction, and the surface opposite to the side surface 1a. The side surface 1b has a side surface 6b of the electrode 6 and a side surface 7b of the electrode 7. The side surfaces 6b and 7b are surfaces parallel to the side surfaces 6c and 7c.

Figure 3:
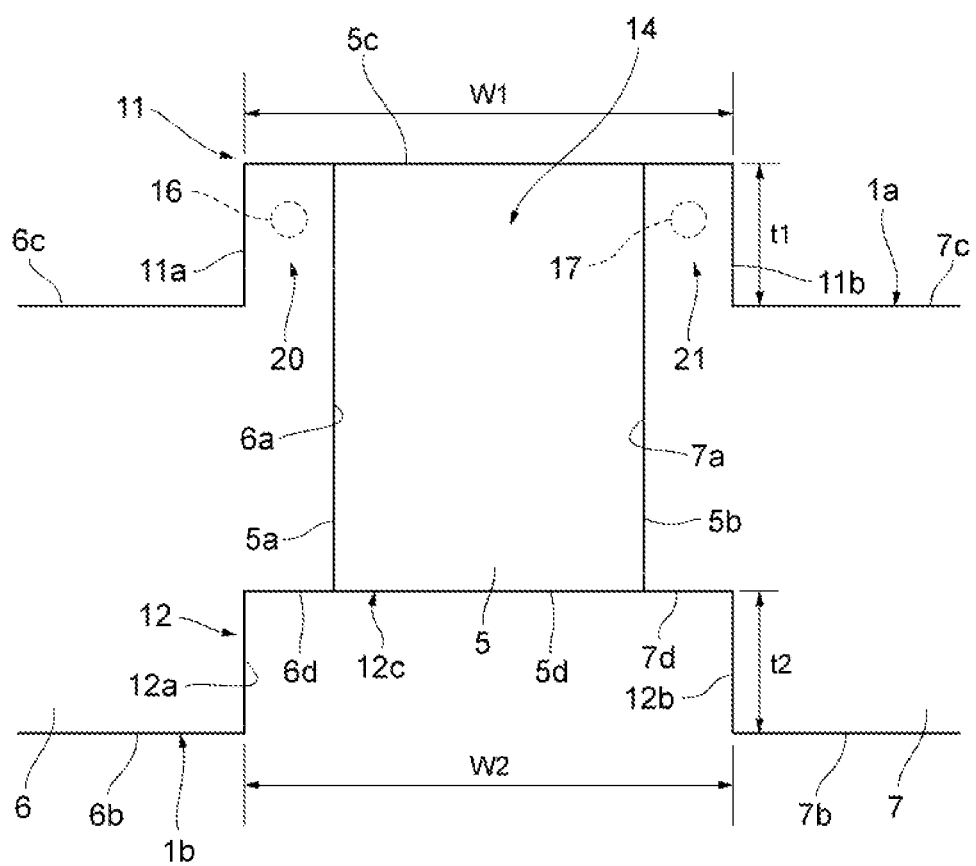
FIG. 3 is an enlarged view of a projecting portion and a recessed portion.

FIG. 3 is an enlarged view of the projecting portion 11 and the recessed portion 12. The projecting portion 11 has a portion of the resistance element 5 and a portion of the electrodes 6 and 7. Specifically, the protecting portion 11 has a portion 14 which is a portion of the resistance element 5 and voltage detecting portions 20 and 21 for measuring voltages generated at the both ends 5a and 5b of the resistance element 5. The length of the portion 14 in the second direction is represented by a length t1 (the length t1 of the projecting portion 11 in the second direction) that is a distance from the side surfaces 6c and 7c of the electrodes 6 and 7 to the side surface 5c of the resistance element 5.

The voltage detecting portions 20 and 21 are portions of the electrodes 6 and 7, respectively. That is, the electrode 6 has the voltage detecting portion 20, and the electrode 7 has the voltage detecting portion 21. The voltage detecting portion 20 extends outward from the side surface 6c of the electrode 6, and the voltage detecting portion 21 extends outward from the side surface 7c of the electrode 7. The voltage detecting portions 20 and 21 are connected to the both ends 5a and 5b of the resistance element 5, respectively.

The voltage detecting portions 20 and 21 are arranged symmetrically with respect to the portion 14. The length of the voltage detecting portions 20 and 21 in the second direction is also represented by the length t1.

The recessed portion 12 has a side surface 5d of the resistance element 5 parallel to the first direction. Specifically, in the present embodiment, the side surface 12c of the recessed portion 12 in the first direction (see FIG. 2) is composed of a side surface 6d of the electrode 6, a side surface 5d of the resistance element 5, and a side surface 7d of the electrode 7. In this embodiment, at width W1 (a length of the projecting portion 11 in the first direction) of the projecting portion 11 and a width W2 (a length of the recessed portion 12 the first direction) of the recessed portion 12 are the same, and the length t1 of the projecting portion 11 in the second direction (i.e., the width direction of the shunt resistor 1) and the length t2 of the recessed portion 12 in the second direction are the same. A position of the projecting portion 11 in the first direction and a position of the recessed portion 12 in the first direction are the same. That is, a side surface 11a of the projecting portion 11 is arranged on an extension line of the side surface 12a of the recessed portion 12, and a side surface 11b of the projecting portion 11 is arranged on an extension line of the side surface 12b of the recessed portion 12.

Figure 4:
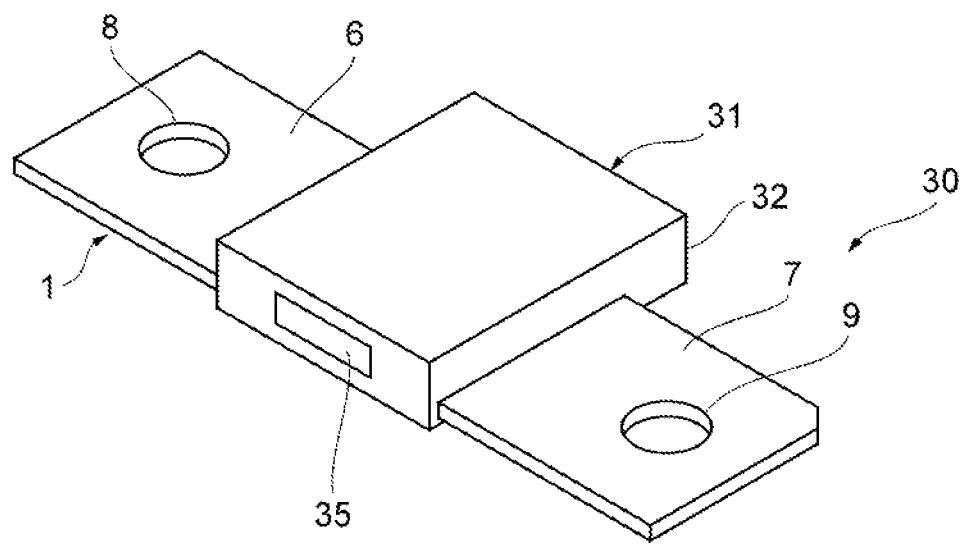
FIG. 4 is a perspective view showing an embodiment of a current detection device including the shunt resistor.

FIG. 4 is a perspective view showing an embodiment of a current detection device 30 including the shunt resistor 1. The current detection device 30 further includes voltage output device 31 that outputs a voltage (the voltage generated at the both ends 5a and 5b of the resistance element 5) of the resistance element 5. The voltage output device 31 is connected to the shunt resistor 1. The voltage output device 31 includes a non-conductive case 32 covering the resistance element 5, and an output terminal 35 (output connector 35) for outputting a voltage signal (voltage of the resistance element 5) from the shunt resistor 1. The output connector 35 includes a first terminal, a second terminal, and a ground terminal (not shown).

Figure 5:
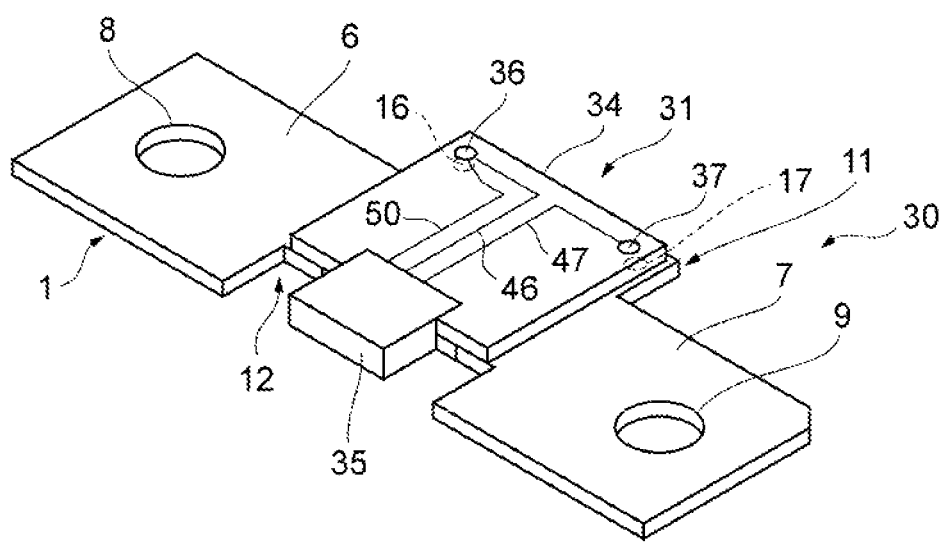
FIG. 5 is a perspective view showing the current detection device when a case of a voltage output device is removed.

FIG. 5 is a perspective view showing the current detection device 30 when the case 32 of the voltage output device 31 is removed. As shown in FIG. 5, the voltage output device 31 further includes a current detection circuit substrate 34. The current detection circuit substrate 34 has voltage signal wirings 46 and 47 for transmitting the voltage signal (voltage of the resistance element 5) from the shunt resistor 1 to the output terminal 35 and a ground wiring 50. A current detection circuit substrate 34 is arranged on the shunt resistor 1, and an output terminal 35 is attached to the recessed portion 12.

The current detection circuit substrate 34 further has voltage terminal pads 36 and 37 (copper foil portions 36 and 37). One end of the voltage signal wiring 46 is connected to the voltage terminal pad 36, and the other end is connected to the first terminal of the output connector 35. One end of the voltage signal wiring 47 is connected to the voltage terminal pad 37, and the other end is connected to the second terminal of the output connector 35. The voltage signal wirings 46 and 47 are bent and wired from the second direction (see FIG. 2) to the first direction (see FIG. 2) above the projecting portion 11. One end of the ground wiring 50 is connected to the voltage terminal pad 36, and the other end is connected to the ground terminal of the output connector 35. The voltage signal wirings 46 and 47, the ground wiring 50, and the voltage terminal pads 36 and 37 are made of a highly conductive metal (copper in this embodiment).

The voltage terminal pad 36 is connected to the voltage detecting portion 16 (see FIG. 3) of the voltage detecting portion 20 of the projecting portion 11 via an internal wiring not shown on the current detection circuit substrate 34. Similarly, the voltage terminal pad 37 is connected to a voltage detecting position 17 (see FIG. 17) of the voltage detecting portion 21 of the projecting portion 11 via the internal wiring not shown. In other words, the voltage signal wirings 46 and 47 are electrically connected to the voltage detecting positions 20 and 21 of the projecting portion 11, respectively. The above-described internal wiring and the voltage detecting portions 20 and 21 are connected by soldering or other methods. An operator connects a cable including a connector that mates with the output terminal 35 to measure the voltage generated at the both ends 5a and 5b of the resistance element 5. This configuration allows for easy measurement of the voltage of the resistance element 5. In one embodiment, an operational amplifier (amplifier), an A/D converter, and/or a temperature sensor for amplifying the voltage signal from the shunt resistor 1 may be mounted on the current detection circuit substrate 34.

Figure 6:
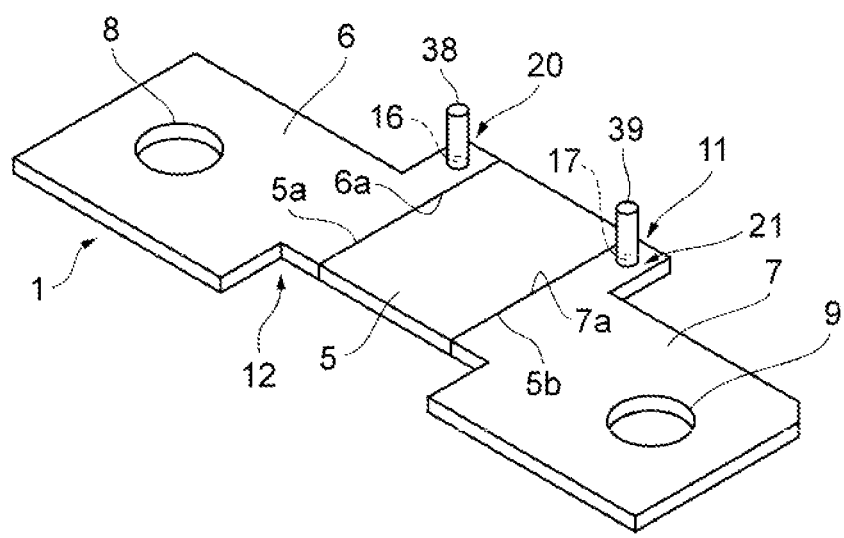
FIG. 6 is a schematic view showing a state in which a voltage detection terminal is provided in the voltage detecting portion.

In one embodiment, as shown in FIG. 6, voltage detection terminals 38 and 39 may be provided on the voltage detecting portions 20 and 21, respectively. The voltage detection terminals 38 and 39 are conductive pins extending vertically from the surfaces of the voltage detecting portions 20 and 21, respectively. Specifically, the voltage detection terminals 38 and 39 are connected to the voltage detecting positions 16 and 17 of the voltage detecting portions 20 and 21 by soldering or the like, respectively. The voltage generated at the both ends of the resistance element 5 is measured by connecting conductive wires (e.g., aluminum wires) to the voltage detection terminals 38 and 39, respectively, or inserting the voltage detection terminals 38 and 39 into through holes formed in a circuit substrate to electrically connect to the wiring formed in the circuit substrate. With such a configuration, the voltage of the resistance element 5 can be measured with a simple configuration.

Figure 7:
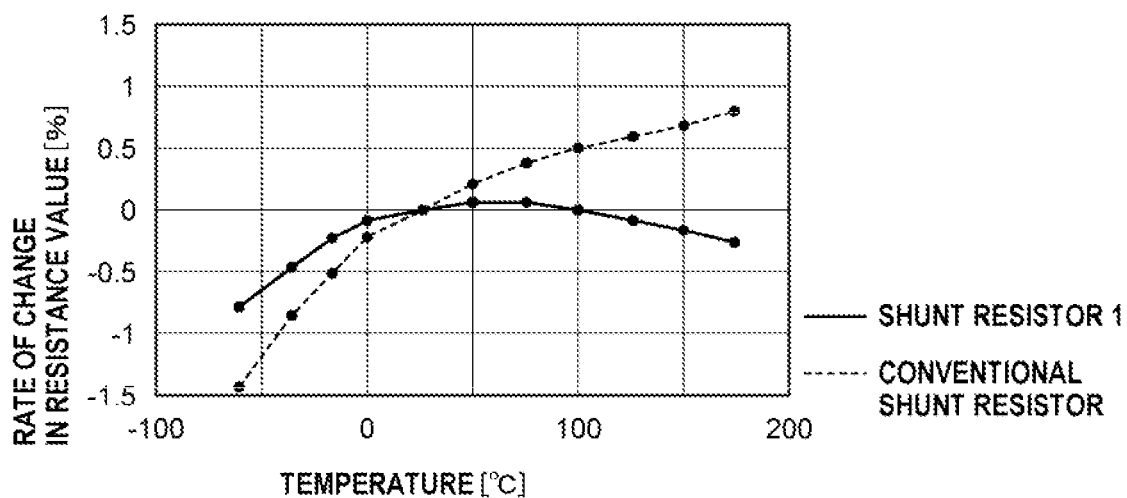
FIG. 7 is a graph showing a rate of change in a resistance value of the shunt resistor due to a temperature change.
Figure 33:
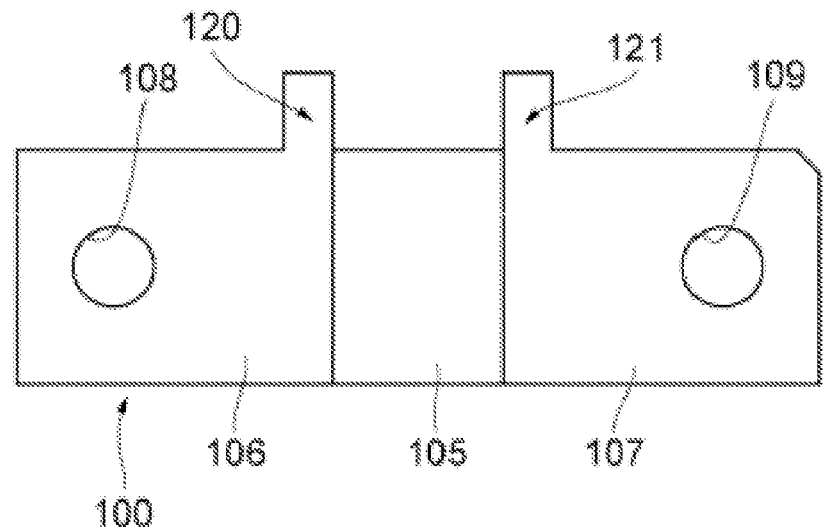
FIG. 33 is a view showing an example of a conventional shunt resistor.
Figure 34:
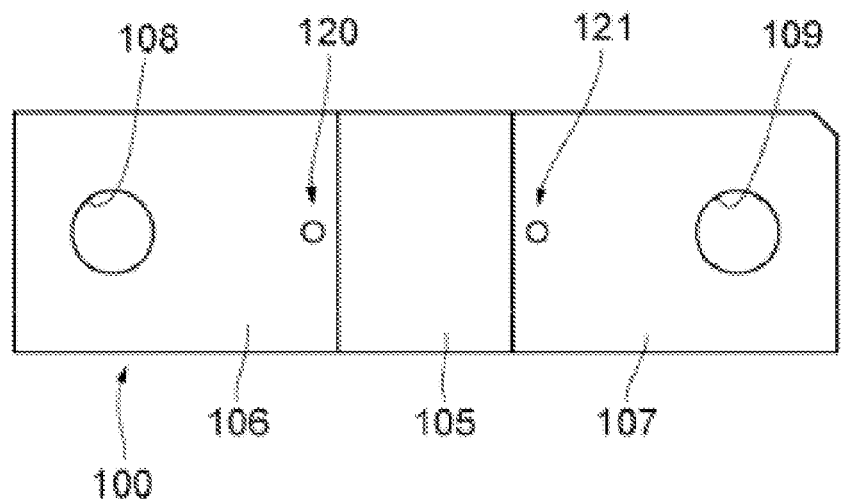
FIG. 34 is a view showing an example of a conventional shunt resistor.

FIG. 7 is a graph showing a rate of change in a resistance value of the shunt resistor 1 due to the temperature change. A horizontal axis of FIG. 7 indicates the temperature of the shunt resistor 1, and a vertical axis of FIG. 7 indicates the rate of change in the resistance value of the shunt resistor 1. A curve indicated by a solid line indicates the rate of change in the resistance value of the shunt resistor 1 of this embodiment, and a curve indicated by a dotted line indicates the rate of change in the resistance value of the conventional shunt resistor (the shunt resistor 100 shown in FIG. 33). FIG. 7 shows results when a copper-manganese alloy is used as the resistance element 5.

As is clear from a comparison of a fluctuation range of the rate of change in the resistance value of the shunt resistor 1 of the present embodiment and a fluctuation range of the rate of change in the resistance value of the conventional shunt resistor, the shunt resistor 1 of the present embodiment can reduce the fluctuation range of the rate of change in the resistance value due to the temperature change. That is, results of FIG. 7 show that the shunt resistor 1 can reduce the temperature coefficient of resistance (TCR). By forming the projecting portion 11 having the portion of the resistance element 5 and the portions of the electrodes 6 and 7 as described above, equipotential lines are distorted, and as a result, the temperature coefficient of resistance of the shunt resistor 1 can be reduced.

Figure 8:
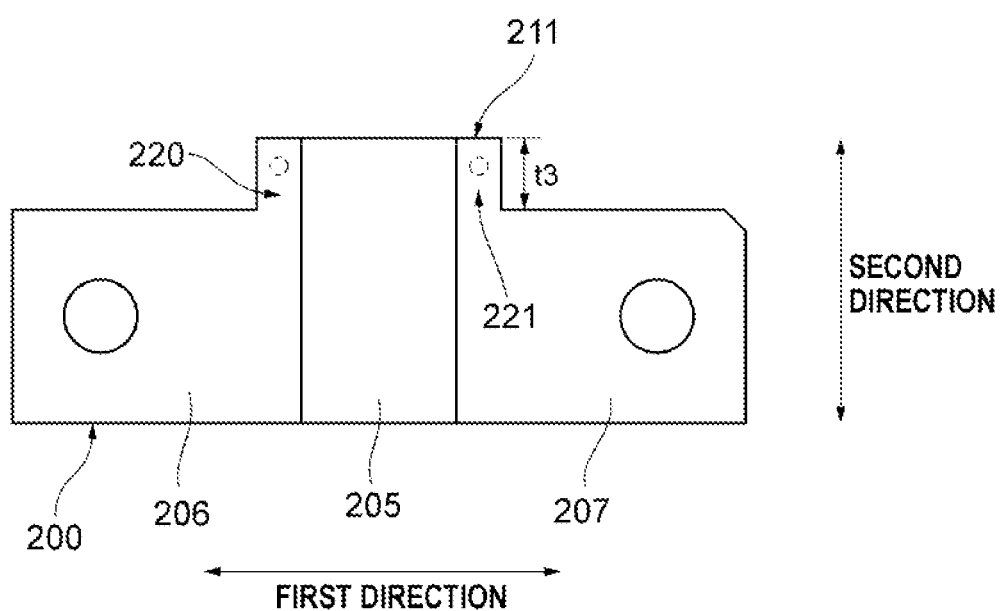
FIG. 8 is a plan view of one embodiment of a shunt resistor without the recessed portion.

FIG. 8 is a plan view of one embodiment of a shunt resistor 200 without the recessed portion 12. Configurations of the shunt resistor 200 are the same as the shunt resistor 1 except that it does not have the recessed portion 12. That is, the shunt resistor 200 includes a resistance element 205 corresponding to the resistance element 5 of the shunt resistor 1, and a pair of electrodes 206 and 207 connected to both ends of the resistance element 205. The electrodes 206 and 207 correspond to the electrodes 6 and 7 of the shunt resistor 1. The shunt resistor 200 has a projecting portion 211 corresponding to the projecting portion 11 of the shunt resistor 1, and the projecting portion 211 has a portion of the resistance element 205 and portions of the electrodes 206 and 207. The projecting portion 211 includes voltage detecting portions 220 and 221 that are portions of the electrodes 206 and 207 arranged symmetrically with respect to the resistance element 205.

Figure 9:
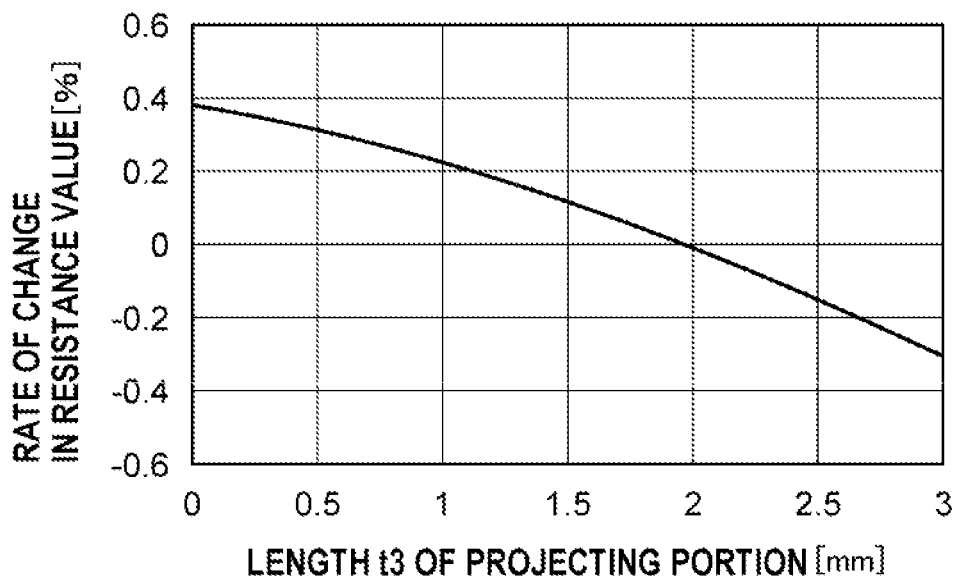
FIG. 9 graph showing a relationship between a length of the projecting portion in a second direction and a rate of change in the resistance value of the shunt resistor.

FIG. 9 is a graph showing a relationship between a length t3 of the projecting portion 211 in the second direction and the rate of change in the resistance value of the shunt resistor 200. FIG. 9 shows results when a copper-manganese alloy is used as the resistance element 205 for a shape of the shunt resistor shown in FIG. 8. A vertical axis of FIG. 9 indicates the rate of change in the resistance value when the temperature of the shunt resistor 200 rises from 25° C. to 100° C. The results of FIG. 9 show that the rate of change in the resistance value of the shunt resistor 200 depends on the length t3. More specifically, as the length t3 increases, the rate of change in the resistance value decreases.

Figure 10:
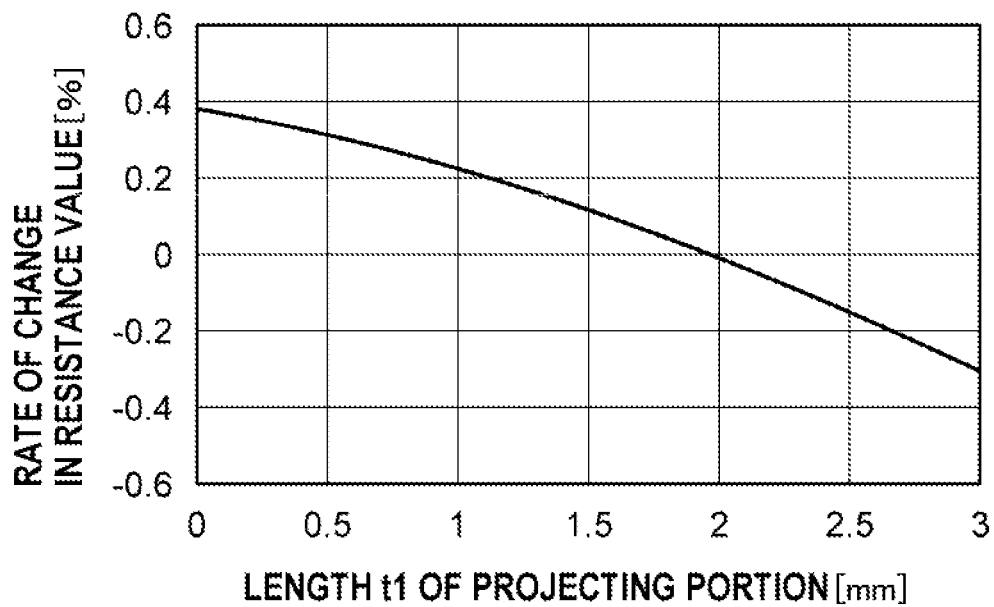
FIG. 10 is a graph showing a relationship between the length of the projecting portion of the shunt resistor and the rate of change in the resistance value of the shunt resistor.

FIG. 10 is a graph showing the relationship between the length t1 of the projecting portion 11 of the shunt resistor 1 and the rate of change in the resistance value of the shunt resistor 1. FIG. 10 shows results when a copper-manganese alloy is used as the resistance element 5 for a shape of the shunt resistor shown in FIG. 2. The length t2 of the recessed portion 12 is the same as the length t1. The vertical axis of FIG. 10 indicates the rate of change in the resistance value when the temperature of the shunt resistor 1 rises from 25° C. to 100° C. Similar to the results in FIG. 9, the results in FIG. 10 indicates that the rate of change in the resistance value of the shunt resistor 1 depends on the length t1, and the length t1 increases, the rate of change in the resistance value decreases. For example, when the length t1 is 2 mm, the rate of change in the resistance value of the shunt resistor 1 is about 0%.

As shown in FIG. 10, a rate at which the rate of change in the resistance value of the shunt resistor 1 decreases is the same as a rate at which the rate of chance in the resistance value of the shunt resistor 200 shown in FIG. 9 decreases. That is, the results of FIG. 10 show that the rate of change in the resistance value depending on the temperature of the shunt resistor 1 depends on the length t1 of the projecting portion 11 rather than the recessed portion 12. Therefore, the results of FIG. 10 show that the temperature coefficient of resistance of the shunt resistor 1 can be corrected and reduced by adjusting the length t1.

Figure 11:
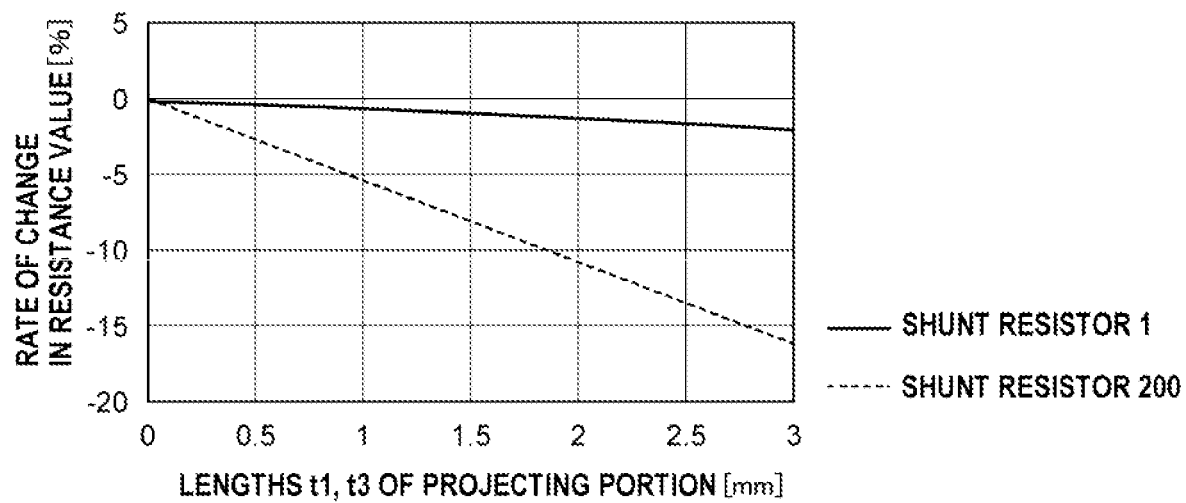
FIG. 11 is a graph showing the rate of change in the resistance value of the shunt resistor.

FIG. 11 is a graph showing the rate of change in the resistance value of each of shunt resistor 1 and the shunt resistor 200. FIG. 11 shows the rates of change of the resistance value of the shunt resistors 1 and 200 due to changes in the lengths t1 and t3 of the projecting portion 11 and 211 at a predetermined temperature (constant temperature). The length t2 of the recessed portion 12 is the same as the length t1. The results of FIG. 11 show that the resistance value of the shunt resistor 200 without the recessed portion 12 varies greatly depending on the length t3 of the projecting portion 211. For example, the resistance value of the shunt resistor 200 when the length t3 is 1.5 mm is approximately 8% lower than the resistance value when the length t3 is 0 mm. This is because the formation of the projecting portion 211 increases the length of the resistance element 205 in the second direction and changes the resistance value of the resistance element 205.

As shown in FIG. 11, in the shunt resistor 1 having the recessed portion 12, the change in the resistance value of the shunt resistor 1 due to the change in the length t1 is suppressed. This is because the length of the resistance element 5 in the second direction is kept constant by forming the recessed portion 12 having the side surfaces 5d of the resistance element 5. That is, it is possible to suppress the change in the resistance value of the shunt resistor 1 due to a formation of the projecting portion 11 by forming the recessed portion 12.

Therefore, by adjusting the length t1 of the projecting portion 11 and the length t2 of the recessed portion 12 of the shunt resistor 1 according to a size and a shape of the shunt resistor 1, the desired TCR can be satisfied while maintaining the desired resistance value. Therefore, according to this embodiment, with a simple structure in which the projecting portion 11 having the portion of the resistance element 5 and the portions of the electrodes 6 and 7 is formed on the side surface 1a of the shunt resistor 1, and in which the recessed portion 12 having the side surface 5d of the resistance element 5 is formed on the side surface 1b of the shunt resistor 1, it is possible to reduce the temperature coefficient of resistance of the shunt resistor 1 while maintaining a desired resistance value.

Figure 12:
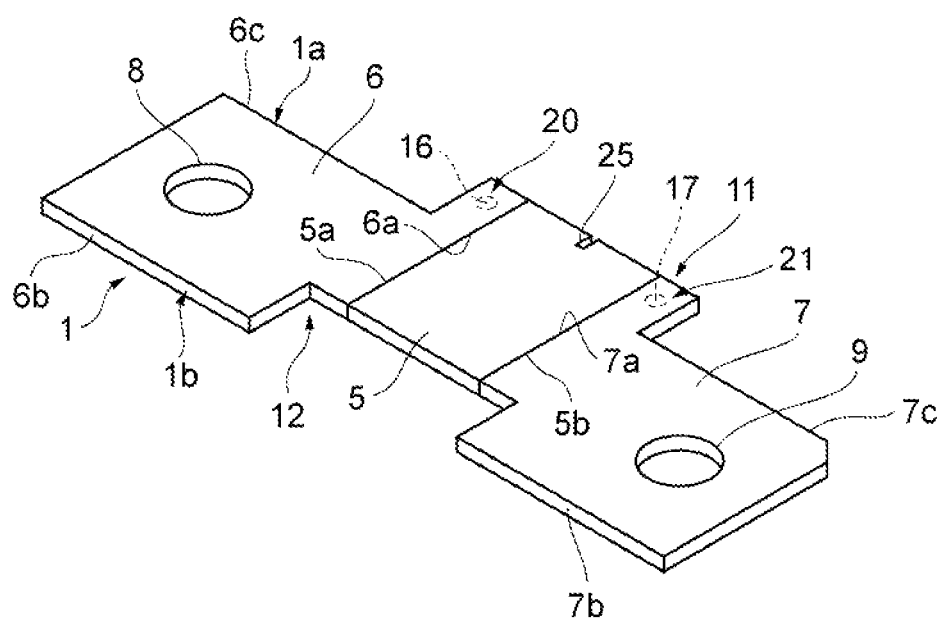
FIG. 12 is a perspective view showing another embodiment of the shunt resistor.
Figure 13:
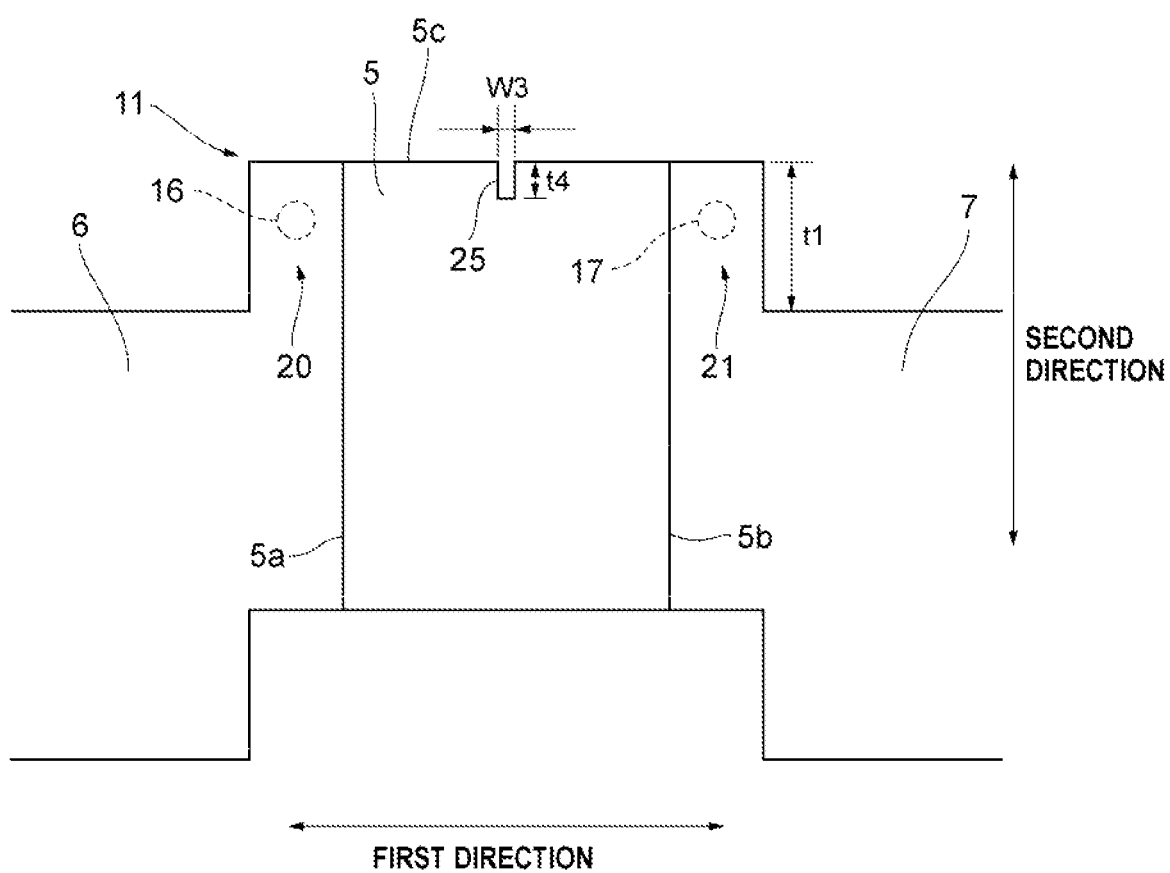
FIG. 13 is enlarged view of the projecting portion of FIG. 12.
Figure 14:
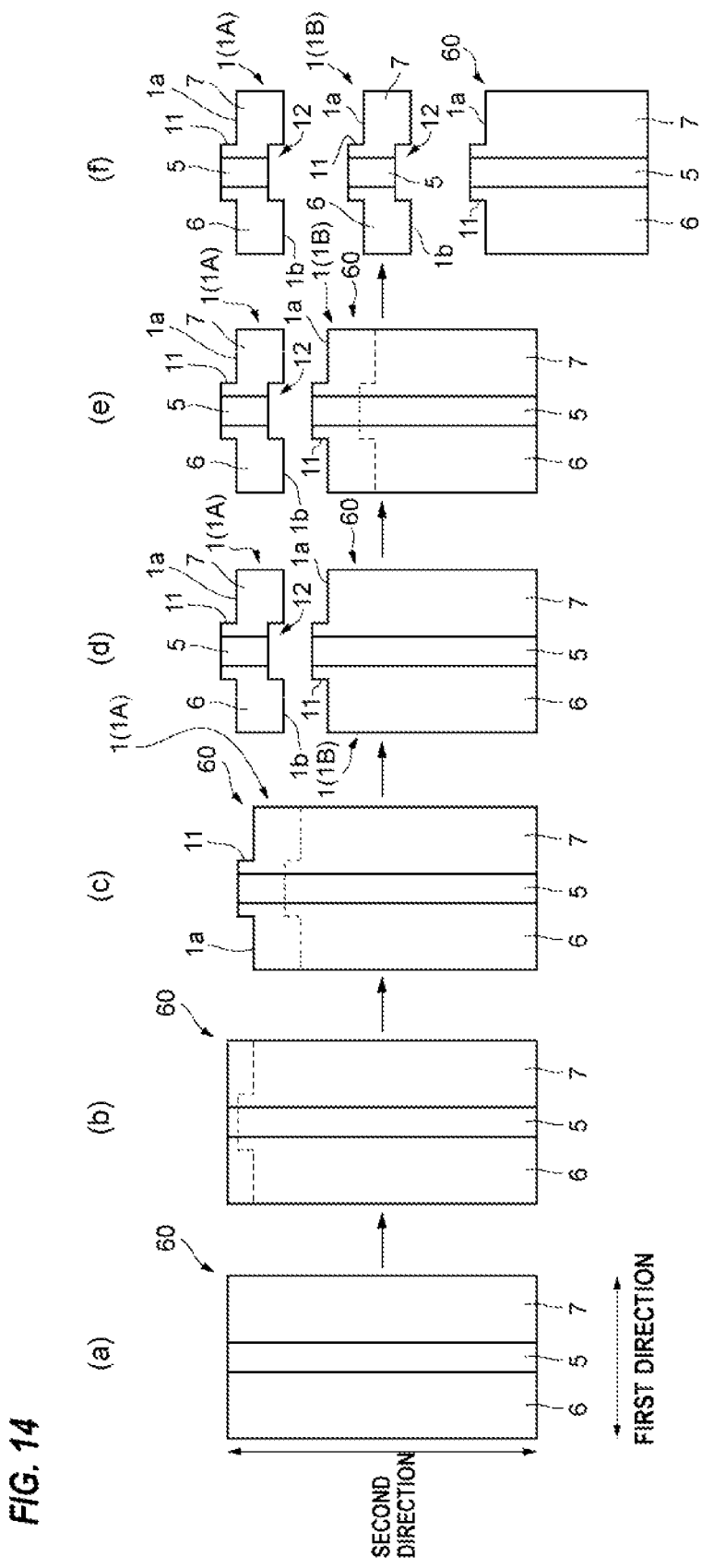
FIG. 14 is a view showing an example of manufacturing processes of the shunt resistor.

FIG. 12 is a perspective view showing another embodiment of the shunt resistor 1, and FIG. 13 is an enlarged view of the projecting portion 11 of FIG. 12. Configurations of this embodiment, which will not be particularly described, are the same as those of the embodiments described with reference to FIGS. 1 to 3, and redundant descriptions thereof will be omitted. The resistance element 5 of this embodiment has a cut portion 25. The cut portion 25 extends parallel to the end surfaces 5a and 5b (in the second direction shown in FIG. 2). The cut portion 25 has a slit-like shape extending linearly. The cut portion 25 is formed on the side surface 5c of the resistance element 5 and linearly extends from the side surface 5c toward an inside of the shunt resistor 1 (the central portion of the shunt resistor 1).

The resistance value of the shunt resistor can be adjusted by forming the cut portion 25 in the resistance element 5, and in addition, the TCR of the shunt resistor 1 can be finely adjusted. Specifically, the TCR can be increased by narrowing a width W3 of the cut portion 25 in the first direction and increasing a length t4 in the second direction. Also in this embodiment, the current detection device 30 described with reference to FIGS. 4 and 5 and the voltage detection terminals 38 and 39 described with reference to FIG. 6 can be applied.

Next, a method for manufacturing the shunt resistor 1 will be described. FIGS. 14(a) to 14(f) are views showing an example of manufacturing processes of the shunt resistor 1. The bolt holes 8 and 9 are omitted in FIGS. 14(a) to 14(f).

First, as shown in FIG. 14(a), a long (belt-shaped) shunt resistor base material 60 (metal plate material) in which the electrodes 6 and 7 are connected to the both ends of the resistance element 5 in the first direction is prepared. Next, as shown in FIG. 14(b), the shunt resistor base material 60 is cut in a direction in which the electrode 6, the resistance element 5, and the electrode 7 are arranged (i.e., the first direction). Specifically, the shunt resistor base material 60 is cut in the first direction in a convex shape. The convex shape is a shape corresponding to the projecting portion 11 of the shunt resistor 1. The side surface 1a and the projecting portion 11 of the shunt resistor 1 (first shunt resistor 1A) are formed (FIG. 14(c)) by cutting the shunt resistor base material 60 in the first direction in the convex shape.

Next, as shown in FIG. 14(c), spacing in the second direction from the projecting portion 11 and the side surface 1a, and the shunt resistor base material 60 is cut in the first direction and in a convex shape, as in FIG. 14(b). As a result, the first shunt resistor 1A is separated from the shunt resistor base material 60, and the side surface 1b of a first shunt resistor 1A, the recessed portion 12 of the first shunt resistor 1A, the projecting portion 11 of the other shunt resistor 1 (second shunt resistor 1B), and the side surface 1a of the second shunt resistor 1B are formed (FIG. 14(d)).

Next, as shown in FIGS. 14(e) and 14(f), spacing in the second direction from the projecting portion 11 and the side surface 1a of the second shunt resistor 1B, and the shunt resistor base material 60 is cut in the first direction and in a convex shape, as in FIGS. 14(c) and 14(d). As a result, the second shunt resistor 1B is separated from the shunt resistor base material 60, and the side surface 1b of the second shunt resistor 1B and the recessed portion 12 of the second shunt resistor 1B are formed. A plurality of shunt resistors 1 are manufactured by repeating steps of FIGS. 14(c) to 14(f).

By manufacturing methods shown in FIGS. 14(a) to 14(f), the shunt resistor 1 can be manufactured in a simple manner, and the shunt resistor base material 60 can be used without waste. As a result, cost reduction can be achieved.

FIGS. 15 to 18 are schematic views showing still another embodiment of the shunt resistor 1. Configurations of this embodiment, which will not be particularly described, are the same as those of the embodiments described with reference to FIGS. 1 to 3, and redundant descriptions thereof will be omitted. In FIGS. 15 to 18, the bolt holes 8 and 9 are omitted. In the embodiments shown in FIGS. 15 to 18, the current detection device 30 described with reference to FIGS. 4 and 5, and the voltage detection terminals 38 and 39 described with reference to FIG. 6 can be applied.

Figure 15:
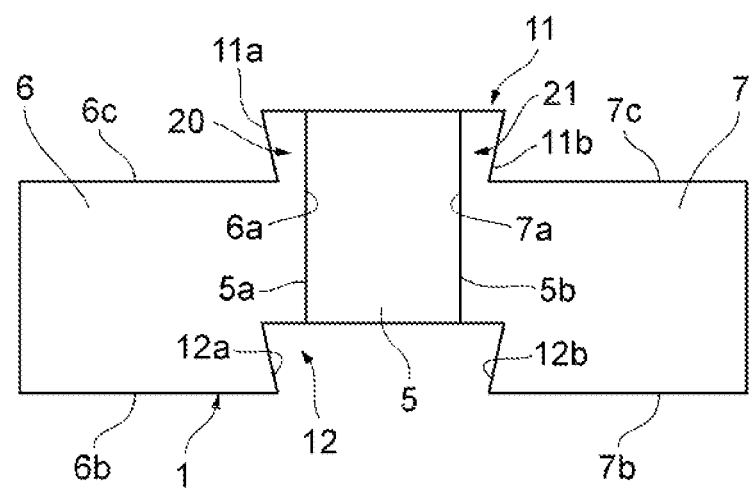
FIG. 15 is a schematic view showing still another embodiment of the shunt resistor.

In one embodiment, as shown in FIG. 15, the side surfaces 11a and 11b of the projecting portion 11 and the side surfaces 12a and 12b of the recessed portion 12 may be formed obliquely with respect to the second direction (see FIG. 2). In an example shown in FIG. 15, the side surfaces 11a and 11b extend away from the resistance element 5. The side surface 12a is formed parallel to the side surface 11a, and the side surface 12b is formed parallel to the side surface 11b.

Figure 16:
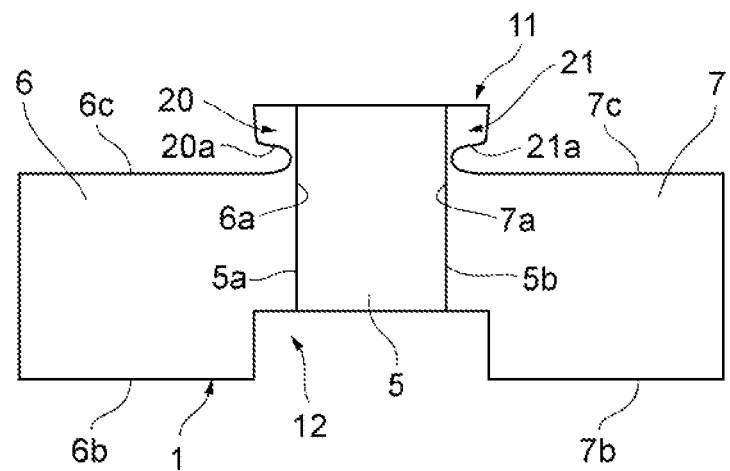
FIG. 16 is a schematic view showing still another embodiment of the shunt resistor.
Figure 17:
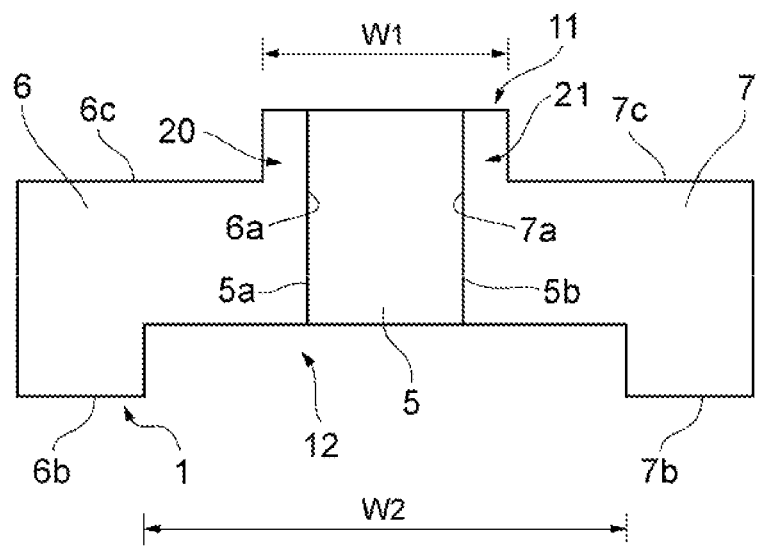
FIG. 17 is a schematic view showing still another embodiment of the shunt resistor.
Figure 18:
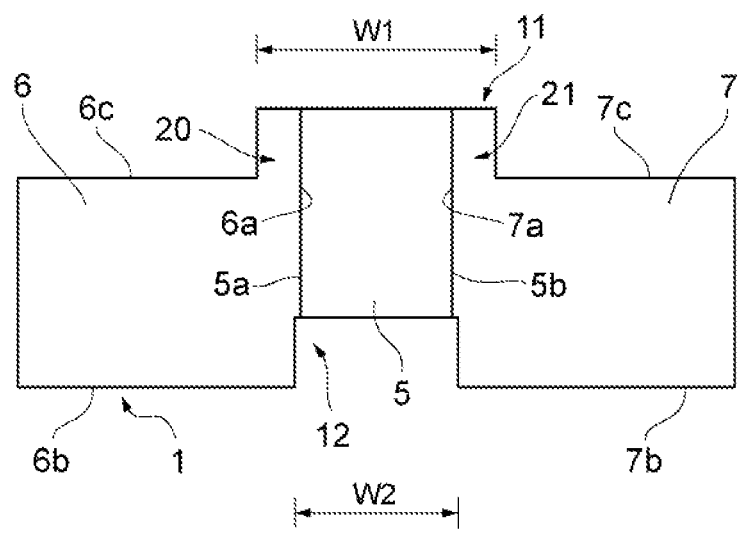
FIG. 18 is a schematic view showing still another embodiment of the shunt resistor.

In one embodiment, as shown in FIG. 16, the voltage detecting portions 20 and 21 may have cut portions 20a and 20b extending from the side surface 11a and 11b toward the resistance element 5, respectively. In one embodiment, as shown in FIG. 17, the width W2 of the recessed portion 12 may be larger than the width W1 of the projecting portion 11. As shown in FIG. 18, and the width W2 may be smaller than the width W1.

Figure 19:
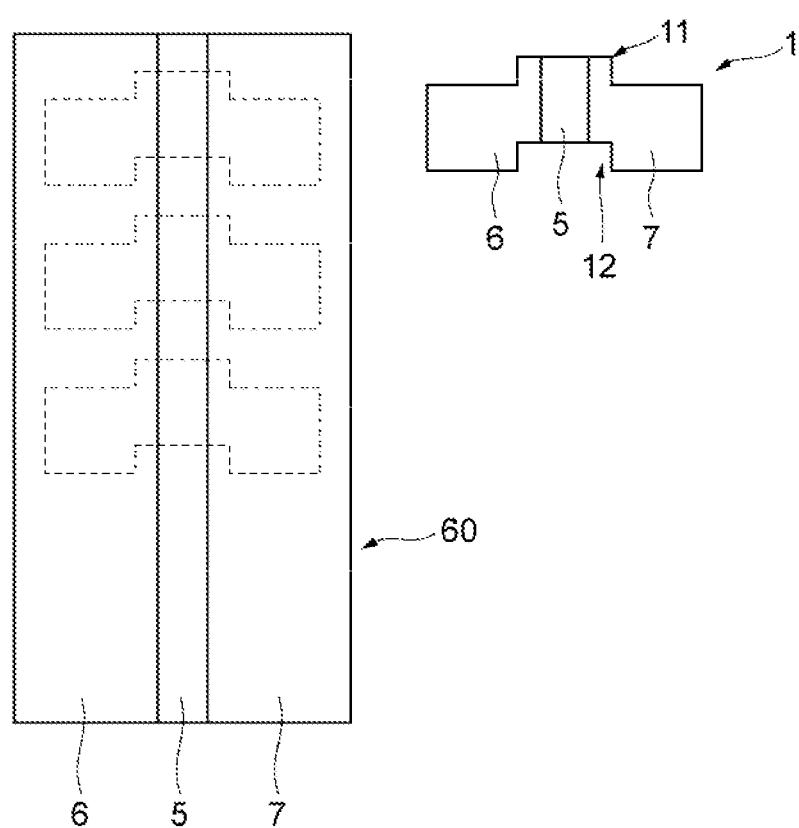
FIG. 19 is a schematic view showing another embodiment of the manufacturing method of the shunt resistor.
Figure 20:
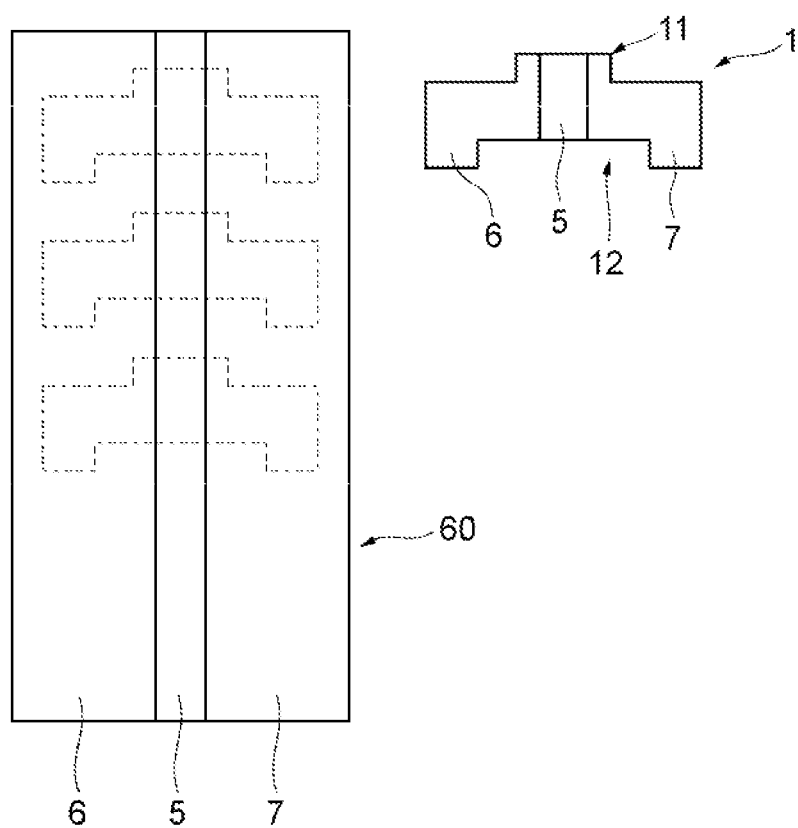
FIG. 20 is a schematic view showing another embodiment of the manufacturing method of the shunt resistor.

FIG. 19 is a schematic view showing another embodiment of the manufacturing method of the shunt resistor 1. As shown in FIG. 19, the shunt resistor 1 may be manufactured by punching the shunt resistor base material 60 into an external shape of the shunt resistor 1. As shown in FIG. 20, the shunt resistor 1 of the embodiment shown in FIG. 17 may be manufactured by the same method as described with reference to FIG. 19.

Figure 21:
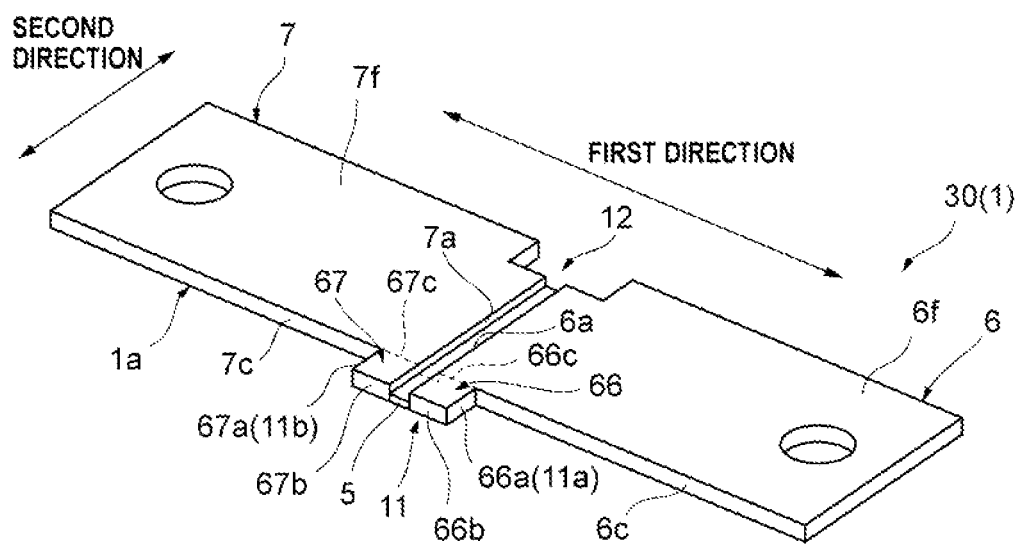
FIG. 21 is a perspective view showing another embodiment of the current detection device.
Figure 22:
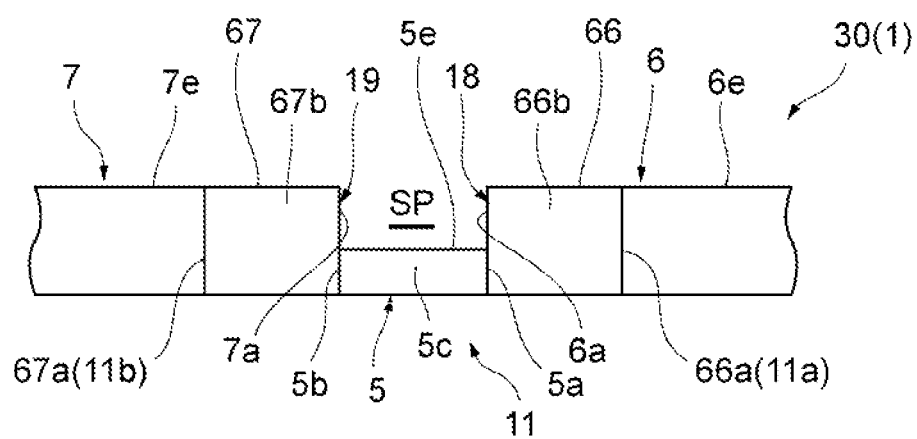
FIG. 22 is a side view of the current detection device shown in FIG. 21.

FIG. 21 is a perspective view showing another embodiment of the current detection device 30, and FIG. 22 is a side view of the current detection device 30 shown in FIG. 21. The current detection device 30 of this embodiment includes the shunt resistor 1. In other words, the current detection device 30 of this embodiment is the shunt resistor 1 itself.

The shunt resistor 1 shown in FIGS. 21 and 22 shows another embodiment of the shunt resistor 1 described with reference to FIGS. 1 to 7 and FIGS. 10 to 20. The configuration of the shunt resistor 1 of this embodiment, which is not described in particular, is the same as the embodiment described with reference to FIGS. 1 to 3, so its redundant description is omitted.

In this embodiment, the electrodes 6 and 7 have first wall portions 66b and 67b along the first direction forming the portion of the projecting portion 11, and second wall portions 66a and 67a along the second direction forming the portion of the projecting portion 11. The first walls 66b and 67b are formed on the same plane as the side surface 5c of the resistance element 5. The second wall portions 66a and 67a correspond to the side surfaces 11a and 11b described above. In this embodiment, the first wall portion 66b and the first wall portion 67b have the same length, and the second wall portion 66a and the second wall portion 67a have the same length.

The electrode 6 has a detection area 66 demarcated by the first wall portion 66b, the second wall portion 66a, a leading end portion 66c, which is a boundary between the projecting portion 11 and a body 6f of the electrode 6, and the contact surface 6a, which is at least partially in contact with the resistance element 5. The electrode 7 has a detection area 67 demarcated by the first wall portion 67b, the second wall portion 67a, a leading end portion 67c, which is a boundary between the projecting portion 11 and a body 7f of the electrode 7, and the contact surface 7a, which is at least partially in contact with the resistance element 5.

The bodies 6f and 7f are portions of the electrodes 6 and 7 other than a portion forming the projecting portion 11. In other words, the bodies 6f and 7f are portions that form a main current path. A main current is a main flow of current. The current also flows through the projecting portion 11, but mainly flows through the body 6f, a body of the resistance element 5 (a portion other than the portion 14 of the resistance element 5), and the body 7f. The leading end portion is an imaginary straight line extending from the side surfaces 6c and 7c of the electrodes 6 and 7 (bodies 6f and 7f) toward the resistance element 5.

As shown in FIGS. 21 and 22, the thicknesses of the electrodes 6 and 7 are thicker than that of the resistance element 5 in this embodiment. As shown in FIG. 22, back surfaces of the electrodes 6 and 7 and a back surface of the resistance element 5 are on the same plane, and surfaces 6e and 7e of the electrodes 6 and 7 are higher than a surface 5e of the resistance element 5. A step 18 is formed by the surface 6e of the electrode 6, the contact surface 6a, and the surface 5e of the resistance element 5. A step 19 is formed by the surface 7e of the electrode 7, the contact surface 7a, and the surface 5e of the resistance element 5. A space SP is formed by the step 18 and 19 and the surface 5e.

In other words, the detection areas 66 and 67 project from the resistance element 5 in the thickness direction (thickness direction of the shunt resistor 1) of the current detection device 30. The thickness direction of the current detection device 30 (shunt resistor 1) is a direction perpendicular to both the first direction and the second direction. According to the structure of the shunt resistor 1, when a substrate such as the current detection circuit substrate 34 is placed on the surface of the shunt resistor 1, a gap (space SP) is formed between the resistance element 5 and the substrate. This can prevent a heat generated by the resistance element 5 from being directly transmitted to the substrate. It is also possible to arrange wirings (e.g., voltage signal wirings 46 and 47) for voltage detection on the space SP. There is no resistance element 5 between the detection areas 66 and 67. Therefore, since the current flowing through the shunt resistor 1 avoids the surfaces of the detection areas 66 and 67, stable voltage detection can be performed. In one embodiment, the electrodes 6 and 7 and the resistance element 5 may have the same thickness. Furthermore, in one embodiment, the shunt resistor 1 may not have the recessed portion 12.

Figure 23:
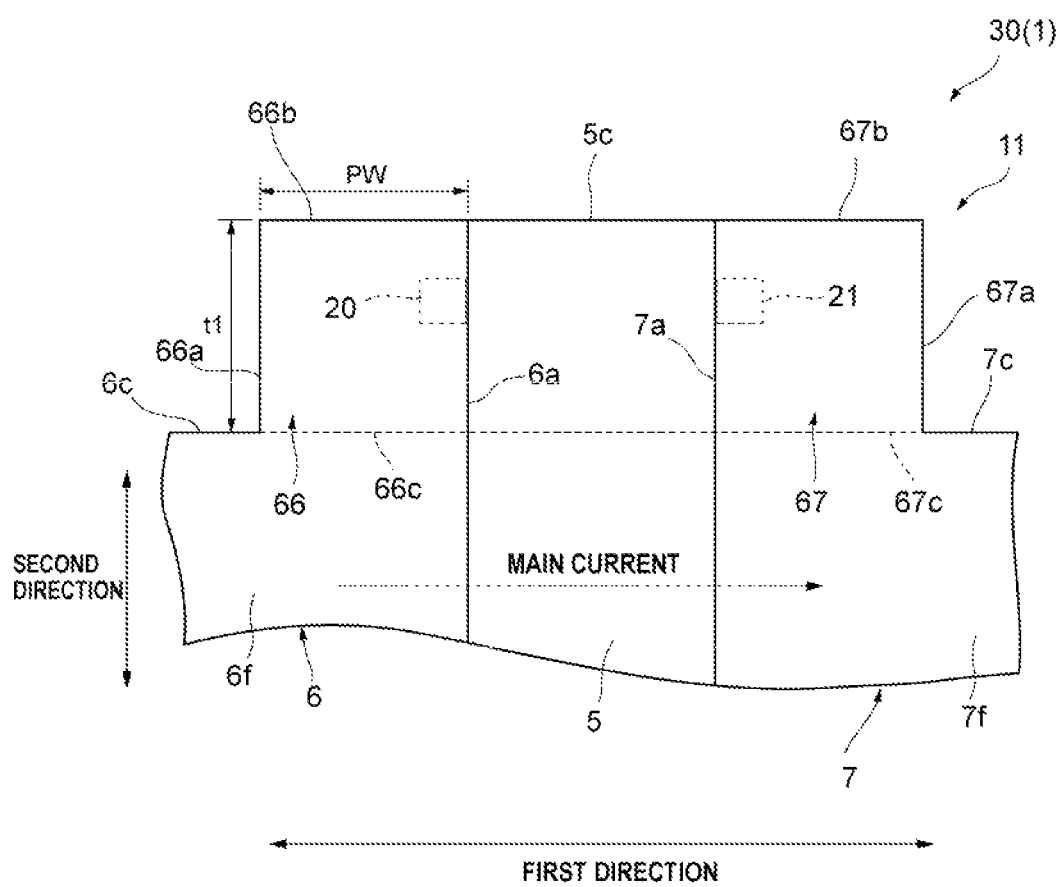
FIG. 23 is an enlarged view of the projecting in FIG. 21.

FIG. 23 is an enlarged view of the projecting portion 11 in FIG. 21. In the embodiment described with reference to FIGS. 1 to 3, the voltage detecting portions 20 and 21 are entire portions of the electrodes 6 and 7 forming the projecting portion 11 of the electrodes 6 and 7. In this embodiment, the voltage detecting portions 20 and 21 are arranged in the detection areas 66 and 67 with a gap between the leading end portions 66c and 67c. The positions and the shapes of the voltage detecting portions 20 and 21 are not limited to the position and the shape shown in FIG. 23.

Figure 24:
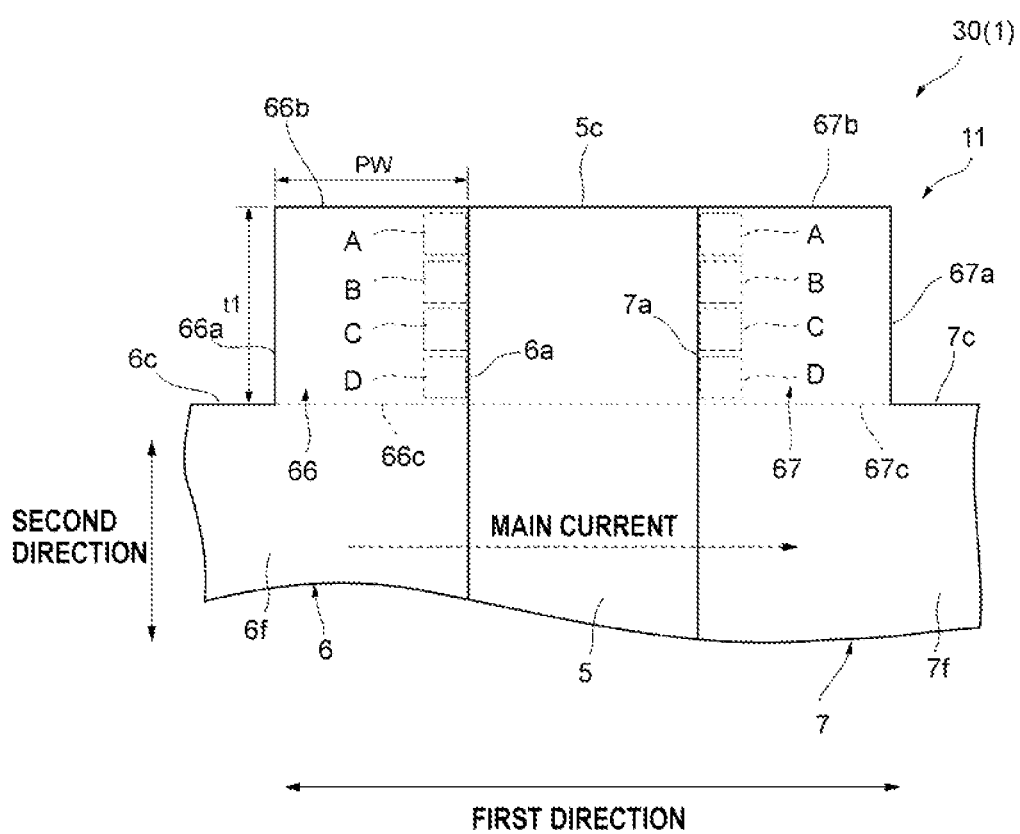
FIG. 24 is a schematic view for explaining positions of voltage detecting portions.
Figure 25:
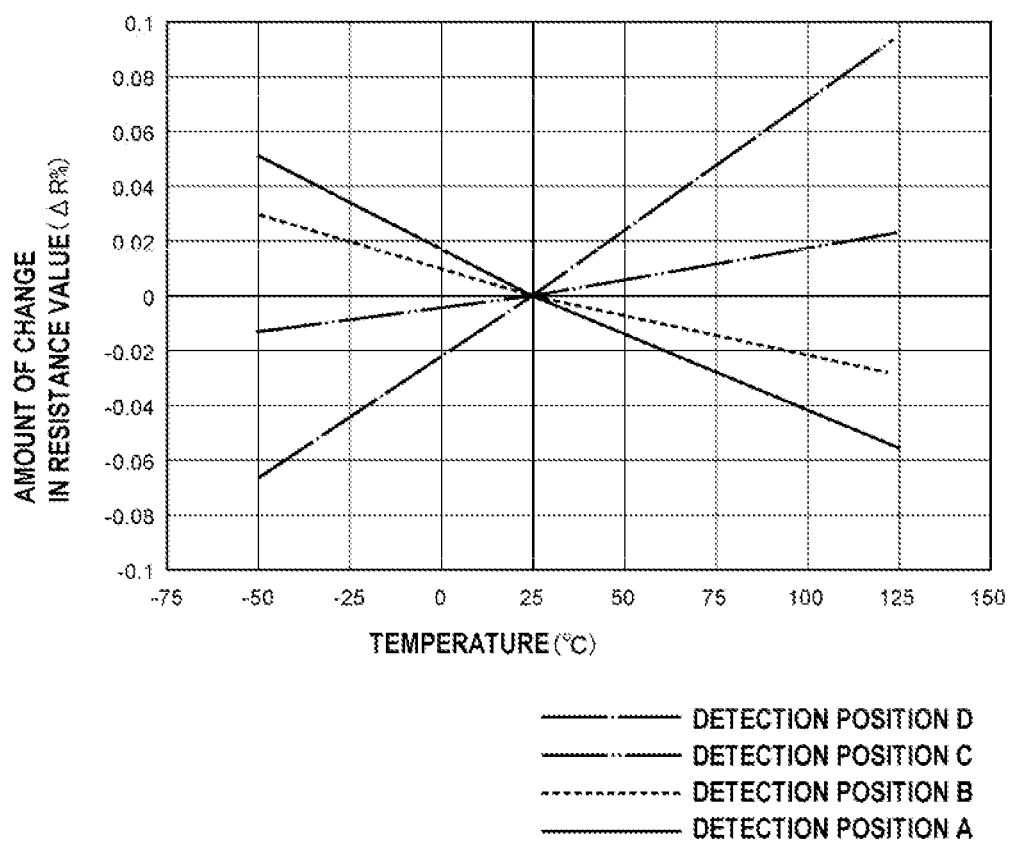
FIG. 25 is a graph showing an amount of change in the resistance value of the shunt resistor due to change in temperature for each detection position shown in FIG. 24.

FIG. 24 is a schematic view for explaining the positions of the voltage detecting portions 20 and 21, and FIG. 25 is a graph showing an amount of change in the resistance value of the shunt resistor 1 due to change in temperature for each detection position shown in FIG. 24. FIG. 25 shows simulation results of temperature characteristics of the resistance value of the shunt resistor 1 when the voltage detecting portions 20 and 21 are arranged at detection positions A to D in FIG. 24. In the simulation, a voltage drop of the shunt resistor 1 (voltage of the resistance element 5) is measured from the voltage detecting portions 20 and 21 at each of the detection positions A to D, and the resistance value of the shunt resistor 1 is calculated from the measured voltage. In the simulation, a material of the resistance element 5 is assumed to the Ni—Cr alloy. In the simulation, both the length t1 of the second wall portions 66a and 67a and a length PW of the first wall portions 66b and 67b are set to 2 mm.

For example, if the voltage detecting portions 20 and 21 are arranged at the leading end portions 66c and 67c, i.e., arranged on the main current side (bodies 6f and 7f side), the temperature characteristics of the resistance value of the shunt resistor 1 obtained from the voltage detecting portions 20 and 21 approximate the temperature characteristics of the resistance element 5 itself. Therefore, since the detection position D approximates the leading end portions 66c and 67c, the temperature characteristics of the shunt resistor 1 when the voltage detecting portions 20 and 21 are arranged at the detection position D are similar to the temperature characteristics of the resistance element 5.

On the other hand, as shown in FIG. 25, a slope of the temperature characteristic becomes clockwise (slope of the temperature characteristic becomes smaller) as the voltage detecting portions 20 and 21 are farther from the leading end portions 66c and 67c and approximates a terminal end portion (first wall portions 66b and 67b). For example, the temperature characteristic at the detection position D has a positive slope, and the slope is relatively large, but the slope of the temperature characteristic becomes smaller by arranging the voltage detecting portions 20 and 21 at the detection positions A to C. It is also possible to make the slope of the temperature characteristic negative (negative temperature characteristic), as in detection positions A and B. In this manner, the temperature characteristic of the resistance value of the shunt resistor 1 changes depending on the positions of the voltage detecting portions 20 and 21 in the second direction within the detection areas 66 and 67.

In particular, there is an area between the detection positions B and C where the slope (i.e., TCR) of the temperature characteristic of the resistance value of the shunt resistor 1 is almost zero over a wide temperature range. The detection portion C is located 0.5 mm away from the leading end portions 66c and 67c, and the detection position B is located 1.0 mm away from the leading end portions 66c and 67c. Therefore, good TCR characteristics can be obtained by arranging the voltage detecting portions 20 and 21 at positions separated by 0.5 mm or more from the leading end portions 66c and 67c. A distance from the leading end portions 66c and 67c where the voltage detecting portions 20 and 21 are arranged is preferably 0.5 mm or more and 1.0 mm or less.

As described above, the TCR varies depending on the positions of the voltage detecting positions 20 and 21. In a design and manufacturing process of the shunt resistor 1, variations in the characteristics of the resistance material itself (the material of the resistance element 5) and variations in the application of the resistance material can be corrected by the positions of the voltage detecting positions 20 and 21.

For example, reference positions of the voltage detecting portions 20 and 21 are defined corresponding to the temperature characteristics of a predetermined resistive material. If actual temperature characteristics of the resistive material are observed to be more positive than expected, the voltage detecting portions 20 and 21 are adjusted closer to the terminal end portions (first wall portions 66b and 67b) closer than the reference position. If the temperature characteristics of the resistive material are observed to be more negative than expected, the voltage detecting portions 20 and 21 are adjusted closer to the leading end portions 66c and 67c. In this manner, the variations in the characteristics of the resistive material can be corrected by adjusting the positions of the voltage detecting portions 20 and 21.

As described above, in the present embodiment, the desired temperature coefficient of resistance can be satisfied by arranging the voltage detecting portions 20 and 21 at a desired positions with a gap between the leading end portions 66c and 67c in the detection areas 66 and 67 of the electrodes 6 and 7, which constitute a portion of the projecting portion 11 of the current detection device 30.

Figure 26A:
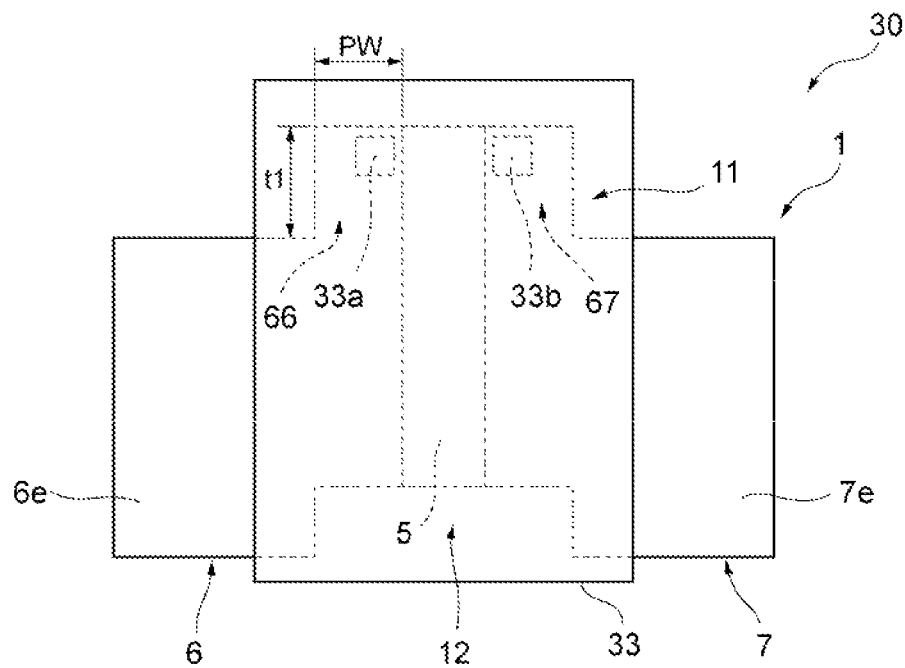
FIG. 26A is a schematic view showing still another embodiment of the current detection device.
Figure 26B:
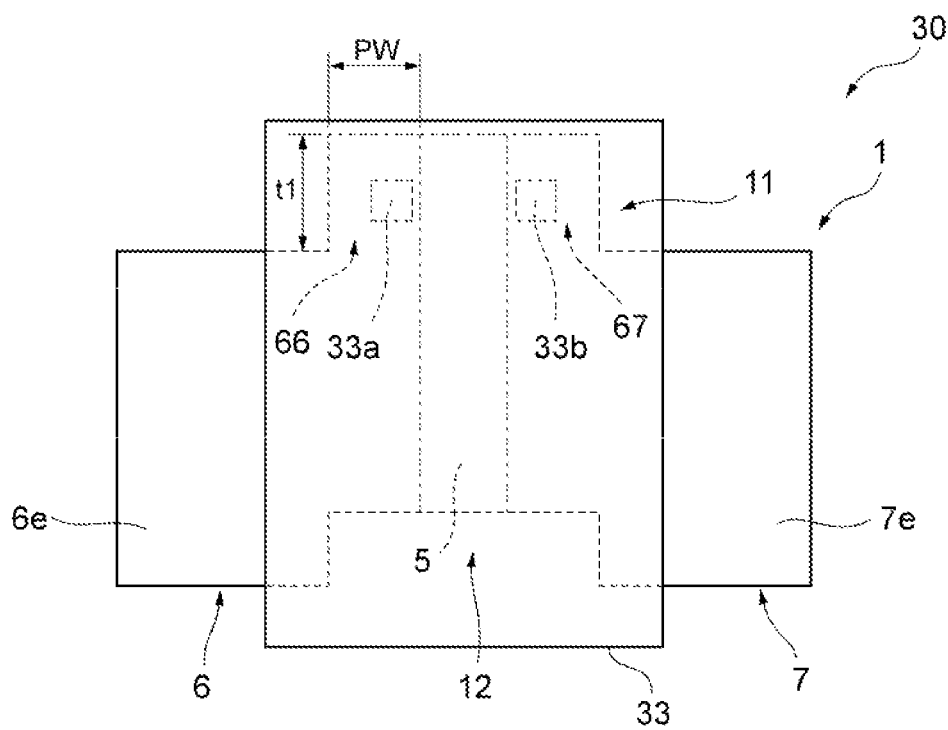
FIG. 26B is a schematic view showing still another embodiment of the current detection device.

FIGS. 26A and 26B are schematic views showing still another embodiment of the current detection device 30. Configurations of this embodiment, which will not be particularly described, are the same as those of the embodiments described with reference to FIGS. 21 to 25, and redundant descriptions thereof will be omitted. As shown in FIGS. 26A and 26B the current detection device 30 of this embodiment includes the shunt resistor 1 and the wiring substrate 33. The wiring substrate 33 includes detection pads 33a and 33b. A wiring (not shown) for transmitting the voltage signal (voltage of the resistance element 5) from the shunt resistor 1 is formed on the wiring substrate 33, and the detection pads 33a and 33b are connected to the wiring (not shown).

The detection pads 33a and 33b are metal thin films and are connected to the voltage detecting portions 20 and 21 (not shown in FIGS. 26A and 26B). FIG. 26B shows as state in which the wiring substrate 33 is connected to the detection areas 66 and 67 by shifting the position of the wiring substrate 33 from FIG. 26A in the second direction (see FIG. 23). In this embodiment, portions on the detection areas 66 and 67 which are connected to the detection pads 33a and 33b are the voltage detection areas 20 and 21.

As shown in FIGS. 26A and 26B, the positions of the detection pads 33a and 33b connected to the detection areas 66 and 67 can be adjusted by adjusting a relative position of the shunt resistor 1 and the wiring substrate 33. In other words, the positions of the voltage detecting portions 20 and 21 can be adjusted by adjusting the relative position of the shunt resistor 1 and the wiring substrate 33. Therefore, the TCR characteristic can be corrected by adjusting the relative position of the shunt resistor 1 and the wiring substrate 33. The width of the detection pads 33a and 33b in the second direction is smaller than t1, and is a size that allows the position adjustment. The temperature characteristic of the shunt resistor 1 tends to improve as the widths of the detection pads 33a and 33b decrease. However, the sizes of the detection pads 33a and 33b are set in consideration of the bondability and the risk of disconnection. By adjusting the positions of the detection pads 33a and 33b, it is possible to change the resistance value of the current detection device 30, which can be applied to a resistance value correction function.

A method of aligning the wiring substrate 33 and the shunt resistor 1 is as follows. First, in an initial flow, using a detection probe, an inherent temperature characteristics of the shunt resistor 1 are measured by measuring the resistance value of the shunt resistor 1 at a predetermined detection position at each of two (or three or more) points, a reference temperature of 25° C. (or 20° C.) and a predetermined temperature (e.g., 125° C.). Thereby, a connection position of the wiring substrate 33 is determined. An alignment between the wiring substrate 33 and the shunt resistor 1 can be performed by positioning of image detection or by providing a reference pin on the shunt resistor 1 or a jig to change the position. In this manner, a mechanism that can relatively control initial characteristics and the voltage detection lead position can be configured in the process.

Figure 27A:
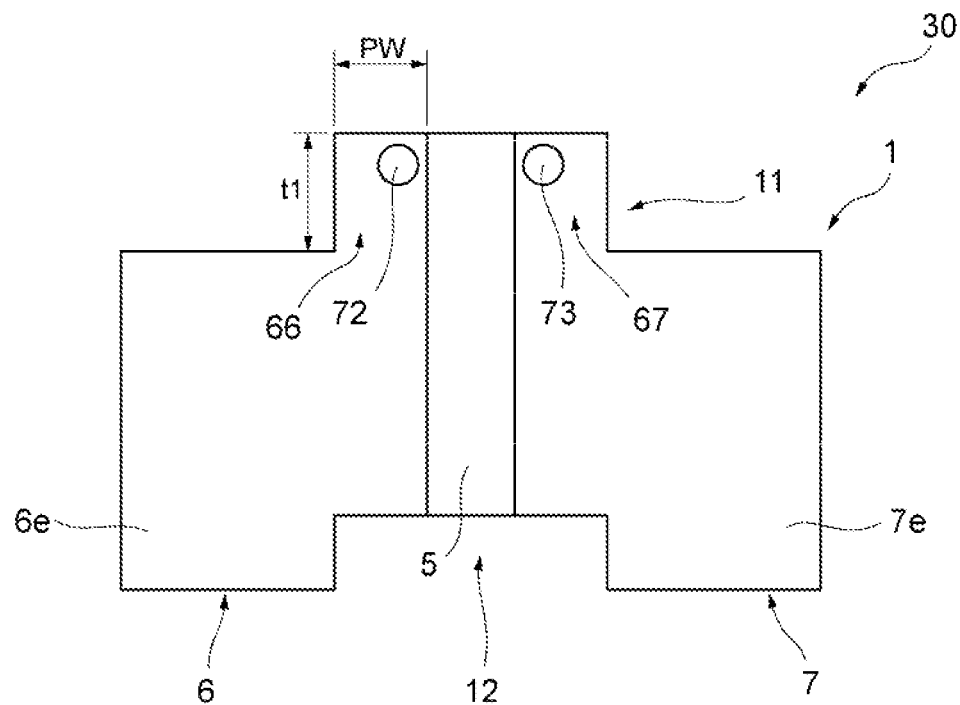
FIG. 27A is a schematic view showing still another embodiment of the current detection device.
Figure 27B:
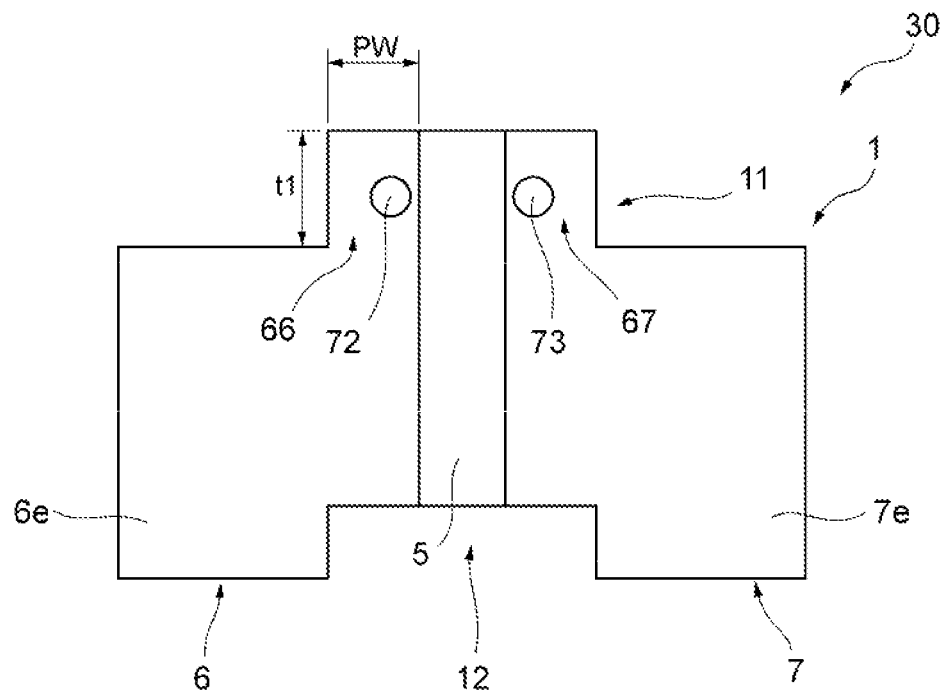
FIG. 27B is a schematic view showing still another embodiment of the current detection device.

FIGS. 27A and 27B are schematic views showing still another embodiment of the current detection device 30. Configurations of this embodiment, which will not be particularly described, are the same as those of the embodiments described with reference to FIGS. 21 to 25, and redundant descriptions thereof will be omitted. As shown in FIGS. 27A and 27B, the current detection device 30 of this embodiment includes the shunt resistor 1 and detection members 72 and 73. The detection members 72 and 73 are connected to the voltage detecting portions 20 and 21 (not shown in FIGS. 27A and 27B) of the detection areas 66 and 67, respectively.

FIG. 27B shows a state in which the detection members 72 and 73 are connected to the detection areas 66 and 67 by shifting the positions of the detection members 72 and 73 from FIG. 27A in the second direction. In this embodiment, portions above the detection areas 66 and 67 connected to the detection members 72 and 73 are the voltage detecting portions 20 and 21. Examples of the detection members 72 and 73 include pads made of solder or other metals, pin terminals, lead frames, or the like.

As shown in FIGS. 27A and 27B, the positions of the voltage detecting portions 20 and 21 (not shown in FIGS. 27A and 27B) can be adjusted by adjusting connection positions of the detection members 72 and 73. Therefore, the TCR characteristics can be corrected by adjusting the positions of the detection members 72 and 73. The widths of the detection members 72 and 73 in the second direction are smaller than t1, and are a size that allows the position adjustment. The temperature characteristic of the shunt resistor 1 tends to improve as the widths of the detection members 72 and 73 decrease. However, the sizes of detection members 72 and 73 are set in consideration of the bondability and the risk of disconnection. By adjusting the positions of the detection members 72 and 73, the resistance value of the current detection device 30 can be changed, which can be applied to the resistance value correction function.

Figure 28A:
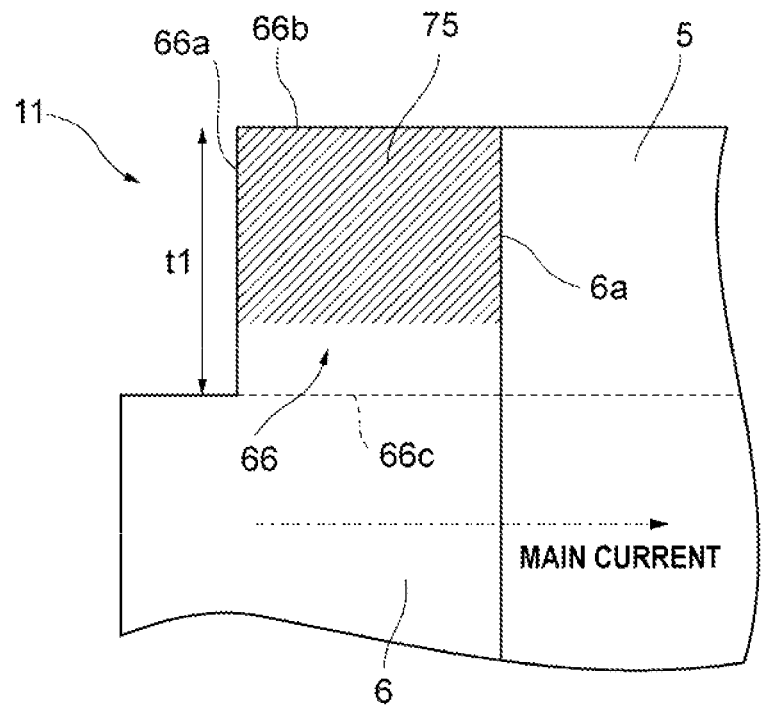
FIG. 28A is a view for explaining the positions of the voltage detecting portions.
Figure 28B:
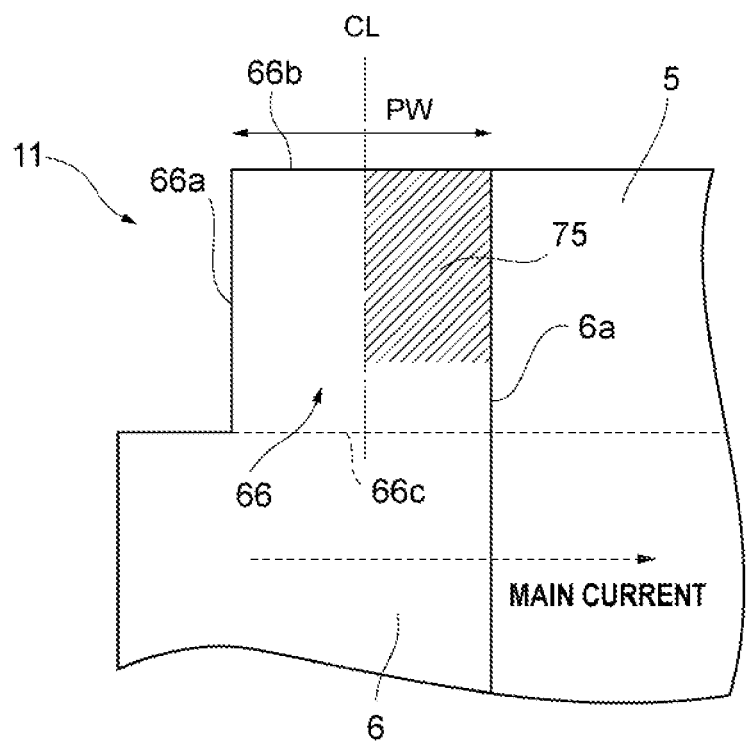
FIG. 28B is a view for explaining the positions of the voltage detecting portions.

FIGS. 28A and 28B are views for explaining the positions of the voltage detecting portions 20 and 21. As described above, when the voltage detecting portions 20 and 21 are arranged at the leading end portions 66c and 67c, the temperature characteristics of the resistance value of the shunt resistor 1 obtained from the voltage detecting portions 20 and 21 approximate the temperature characteristics of the resistance element 5 itself. Therefore, in this embodiment, the voltage detecting portions 20 and 21 are arranged in the detection areas 66 and 67 avoiding the leading end portions 66c and 67c.

In one embodiment, the voltage detecting portion 20 is arranged in a hatched area 75 in FIG. 28A. Although not shown, the voltage detecting portion 21 is arranged symmetrically with the voltage detecting portion 20 with respect to the resistance element 5. Specifically, the voltage detecting portions 20 and 21 are arranged in ¾ area on the terminal side (first wall portions 66b and 67b sides) of the detection areas 66 and 67 in the second direction.

Cu is generally used as the material of the electrodes 6 and 7. In order to reduce an influence of the temperature characteristics of the resistance value of this electrode material, in one embodiment, as shown in FIG. 28B, the voltage detecting portions 20 and 21 may be arranged on the side closer to the resistance element 5 than the center (center line CL) of the detection areas 66 and 67 in the first direction. Specifically, the voltage detecting portion 20 may be arranged in the hatched area 75 in FIG. 28B. Although not shown, the voltage detecting portion 21 is arranged symmetrically with the voltage detecting portion 20 with respect to the resistance element 5. The area 75 in FIG. 28B is ¾ area on the terminal side (first wall portions 66b and 67b sides) of the detection areas 66 and 67 in the second direction and ½ area of the detection areas 66 and 67 on the resistance element 5 side in the first direction.

As described above, the shunt resistor 1 has steps 18 and 19 in this embodiment. Therefore, in one embodiment, a voltage detection member for detecting the voltage of the resistance element 5 may be connected across the steps 18 and 19 (so as to cover the contact surfaces 6a and 7a). As a result, the influence of the temperature characteristics on the resistance value of the material of the electrodes 6 and 7 can be further reduced, and the voltage generated at the both ends 5a and 5b of the resistance element 5 can be measured more accurately. Moreover, the steps 18 and 19 can prevent the voltage detection member from coming into contact with the resistance element 5.

Figure 29:
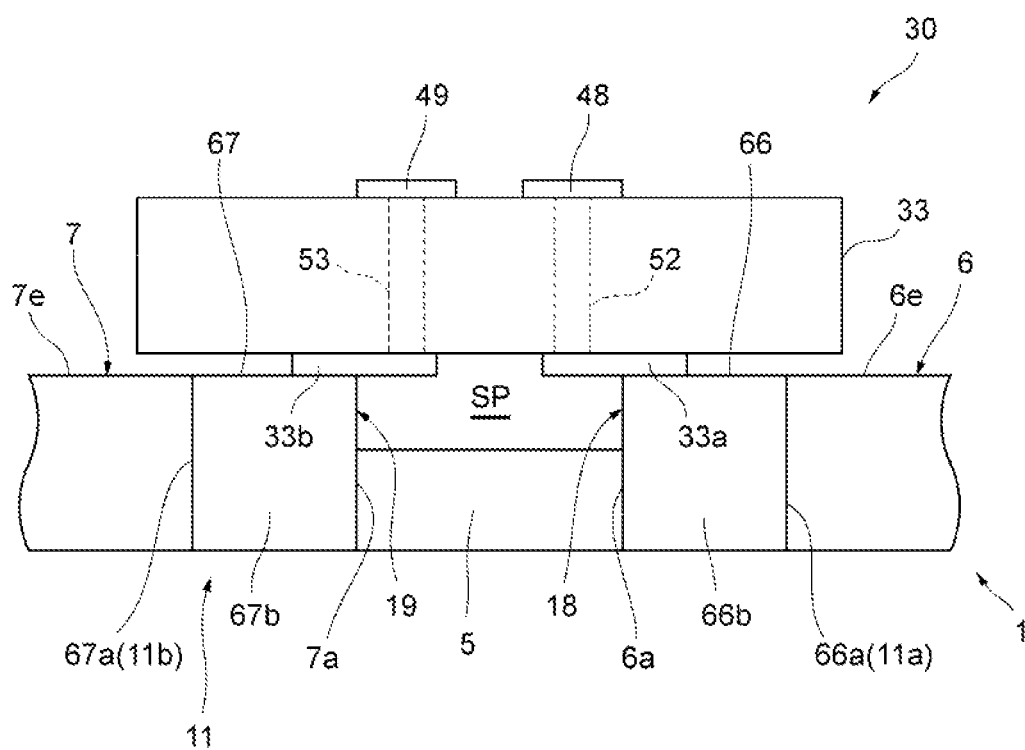
FIG. 29 is a schematic view showing an example in which a voltage detection member is connected across steps.

FIG. 29 is a schematic view showing an example in which the voltage detection member is connected across steps 18 and 19. In this embodiment, the current detection device 30 includes the wiring substrate 33 and the shunt resistor 1. The wiring substrate 33 includes the detection pads 33a and 33b as the voltage detection members. The detection pads 33a and 33b are connected to voltage signal wirings 48 and 49 through via holes 52 and 53, respectively. The detection pads 33a and 33b are connected to the detection areas 66 and 67 across the steps 18 and 19 (so as to cover the contact surfaces 6a and 7a). With such a configuration, the inside of the electrodes 6 and 7 can be used as the voltage detecting portions 20 and 21 (not shown in FIG. 29), and the voltage of the resistance element 5 can be measured without being affected by the characteristics of the electrodes 6 and 7. As a result, the voltage generated at the both ends 5a and 5b of the resistance element 5 can be measured more accurately in this embodiment.

As described above, the resistance element 5 is connected to the electrodes 6 and 7 by means such as welding (e.g., electron beam welding, laser beam welding, or brazing). As a result, unevenness occurs due to welding marks in a joint portion between the resistance element 5 and the electrodes 6 and 7. However, in the present embodiment, the shunt resistor 1 has the steps 18 and 19, so that the voltage detection members can be connected across the steps 18 and 19 without being affected by the above weld marks.

Figure 30:
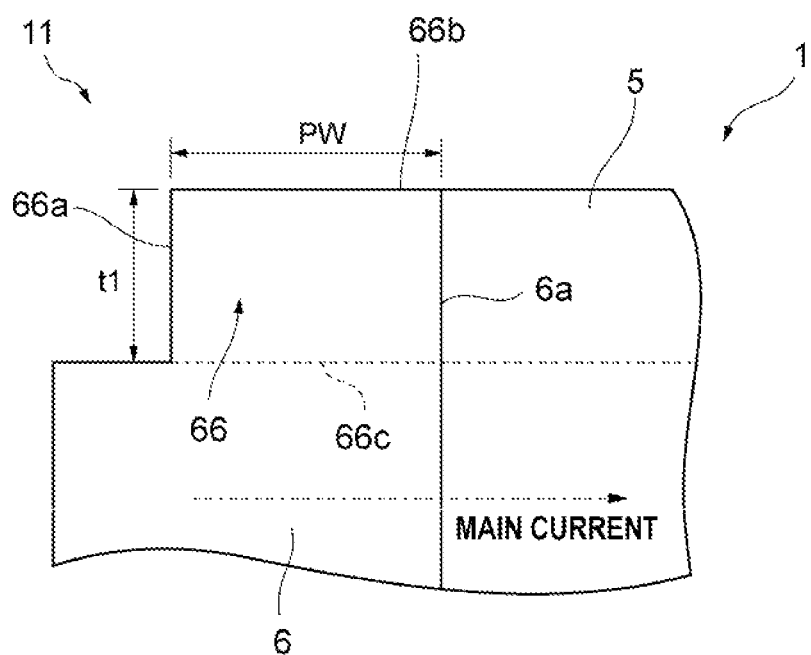
FIG. 30 is a schematic view showing another embodiment of the projecting portion.

FIG. 30 is a schematic view showing another embodiment of the projecting portion 11. It may not be necessary to make the temperature characteristic of the resistance of the shunt resistor 1 have a negative slope. In this case, the length t1 of the second wall portions 66a and 67a need not be longer than necessary. Shortening the length t1 of the second wall portions 66a and 67a can contribute to downsizing and cost reduction of the shunt resistor 1. In one embodiment, as shown in FIG. 30, the length PW of the first wall portions 66b and 67b may be longer than the length t1 of the second wall portions 66a and 67a. For example, PW:t1=4:3 or PW:t1=3:2.

Figure 31:
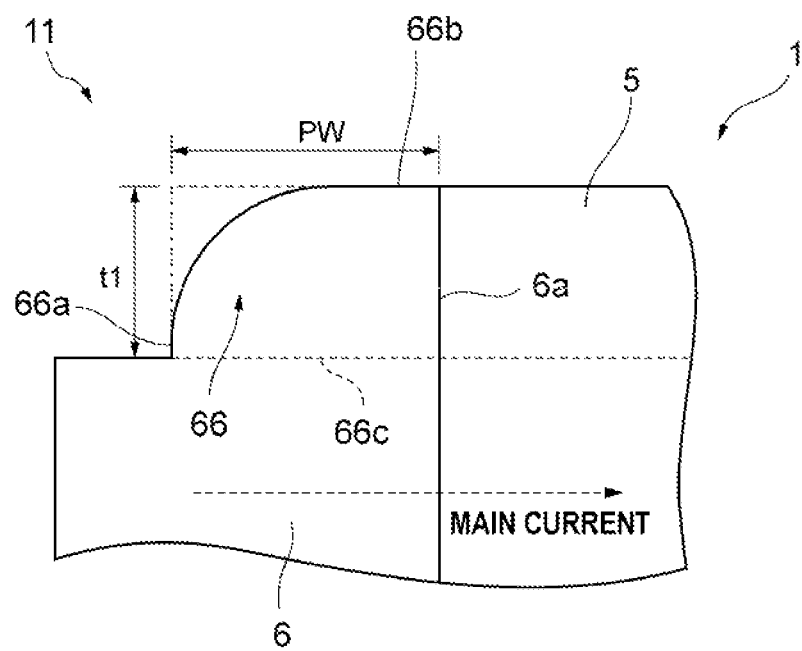
FIG. 31 is a schematic view showing another embodiment of the projecting portion.

Further, in one embodiment, as shown in FIG. 31, corners of the projecting portion 11 may be rounded. Also in this embodiment, a ratio of t1 and PW may be the same as in the embodiment of FIG. 30. Furthermore, in one embodiment, the corners of the projecting portion 11 may be C-planes. Also in this case, the ratio of t1 and PW may be the same as in the embodiment of FIG. 30.

Figure 32:
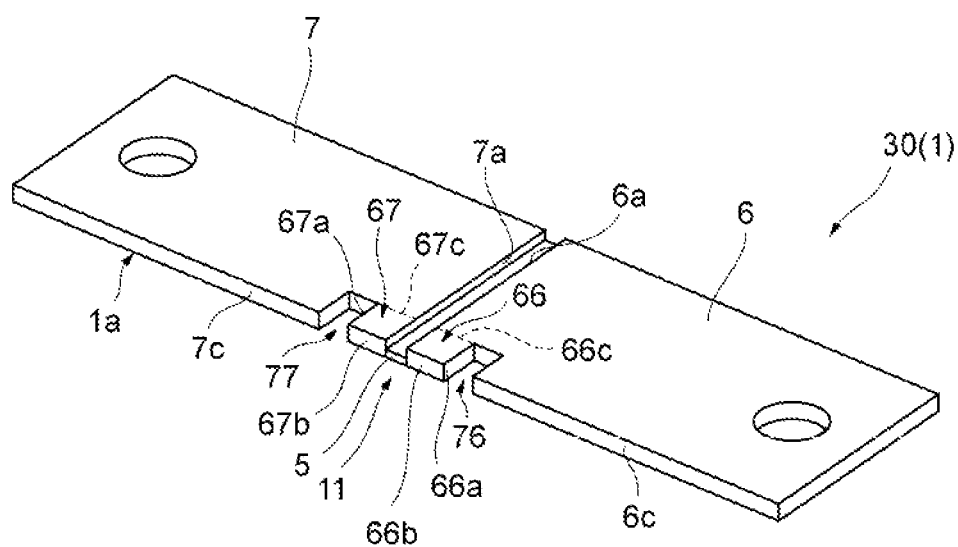
FIG. 32 is a schematic view showing still another embodiment of the current detection device.

FIG. 32 is a schematic view showing still another embodiment of the current detection device 30. Configurations of this embodiment, which will not be particularly described, are the same as those of the embodiments described with reference to FIGS. 21 to 31, and redundant descriptions thereof will be omitted. In this embodiment, the current detection device 30 also includes the shunt resistor 1. In other words, the current detection device 30 of this embodiment is the shunt resistor 1 itself. In this embodiment, slits 76 and 77 are formed in the electrodes 6 and 7. In this embodiment, the shunt resistor 1 does not have recessed portion 12. Specifically, the slits 76 and 77 extend from the sides 6c and 7c toward the inside of the electrodes 6 and 7 (in the second direction (see FIG. 21)). In this embodiment, the projecting portion 11 is formed by the slits 76 and 77. FIGS. 26A to 31 can also be applied to this embodiment, and the effects described with reference to FIGS. 21 to 31 can be obtained.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a current detection device, particularly the current detection device using the shunt resistor.

REFERENCE SIGNS LIST 1 shunt resistor
1A first shunt resistor 1B second shunt resistor
1a, 1b side surface
5 resistance element
5a, 5b both ends (both connecting surfaces)
5c, 5d side surface
5e surface
6, 7 electrode
6a, 7a contact surface
6b, 6c, 6d side surface
7b, 7c, 7d side surface
6e, 7e surface
6f, 7f body
8, 9 bolt hole
11 projecting portion
11a, 11b side surface
12 recessed portion
12a, 12b, 12c side surface
14 portion
16, 17 voltage detecting position
18, 19 step
20, 21 voltage detecting portion
20a, 21a cut portion
25 cut portion
30 current detection device
31 voltage output device
32 case
33 wiring substrate
33a, 33b detection pad
34 current detection circuit substrate
35 output terminal
36, 37 voltage terminal pad
38, 39 voltage detection terminal
46, 47 voltage signal wiring
48, 49 voltage signal wiring
50 ground wiring
52, 53 via hole
60 shunt resistor base material
66, 67 detection area
66a, 67a second wall portion
66b, 67b first wall portion
66c, 67c leading end portion
72, 73 detection member
75 area
76, 77 slit
100 shunt resistor
105 resistance element
106, 107 electrode
108, 109 bolt hole
120, 121 voltage detecting portion
200 shunt resistor
205 resistance element
206, 207 electrode
211 projecting portion
220, 221 voltage detecting portion

The invention claimed is:

1. A current detection device used for current detection, comprising:
a resistance element; and
a pair of electrodes connected to both ends of the resistance element in a first direction,
wherein the current detection device has a projecting portion projecting in a second direction,
the projecting portion has a portion of the resistance element and portions of the pair of electrodes,
the first direction is a direction in which the pair of electrodes are arranged, and the second direction is perpendicular to the first direction,
each electrode has a first wall portion along the first direction forming a portion of the projecting portion, and a second wall portion along the second direction forming the portion of the projecting portion,
each electrode has a detection area demarcated by the first wall portion, the second wall portion, a leading end portion, and a contact surface, the leading end portion being a boundary between the projecting portion and a body of the electrode, the contact surface being at least partially in contact with the resistance element,
each electrode has a voltage detecting portion, the voltage detecting portion being arranged in the detection area with a distance of 0.5 mm or more between the leading end portions,
a thickness of the electrode is thicker than that of the resistance element,
the detection area projects more than the resistance element in a thickness direction of the current detection device, and
the electrode and the resistance element are stepped.

2. The current detection device according to claim 1, wherein the voltage detecting portion is arranged closer to the resistance element than a center of the detection area.

3. The current detection device according to claim 1, wherein a length of the first wall portion is longer than a length of the second wall portion.

4. The current detection device according to claim 1, further comprising a wiring substrate,
wherein the wiring substrate comprises a detection pad connected to the voltage detecting portion.

* * * * *